United States Patent [19]

Swarztrauber et al.

[11] Patent Number: 4,783,748
[45] Date of Patent: Nov. 8, 1988

[54] METHOD AND APPARATUS FOR REMOTE MEASUREMENT

[75] Inventors: Sayre Swarztrauber, New York, N.Y.; Michael R. Newsome, Wyckoff, N.J.; Mark C. Stern, New York, N.Y.

[73] Assignee: Quadlogic Controls Corporation, New York, N.Y.

[21] Appl. No.: 22,554

[22] Filed: Mar. 4, 1987

Related U.S. Application Data

[63] Continuation of Ser. No. 560,068, Dec. 9, 1983, abandoned.

[51] Int. Cl.[4] .............. G01R 21/06; G01R 19/14; G01R 11/32
[52] U.S. Cl. .................... 364/483; 324/142; 340/310 A; 340/825.08; 364/492
[58] Field of Search ............ 324/142; 340/310 A, 340/825.08; 364/483, 492

[56] References Cited

U.S. PATENT DOCUMENTS

| | | | |
|---|---|---|---|
| 3,153,780 | 10/1964 | Zaubi | 340/870.02 |
| 3,747,068 | 7/1973 | Bruner et al. | 324/103 R X |
| 3,818,481 | 6/1974 | Dorfman et al. | 340/310 R |
| 4,004,097 | 1/1977 | Spaulding | 340/870.02 X |
| 4,077,061 | 2/1978 | Johnston et al. | 364/483 |
| 4,139,735 | 2/1979 | Dorfman et al. | 340/310 R |
| 4,161,720 | 7/1979 | Bogacki | 340/870.03 X |
| 4,207,557 | 6/1980 | Gilkeson et al. | 324/142 X |
| 4,239,940 | 12/1980 | Dorfman | 340/310 R X |
| 4,264,960 | 4/1981 | Gurr | 364/492 |
| 4,270,206 | 5/1981 | Hughes | 340/310 A X |
| 4,300,125 | 11/1981 | Loshing et al. | 324/142 X |
| 4,302,750 | 11/1981 | Wadhwani et al. | 340/310 A X |
| 4,345,311 | 8/1982 | Fielden | 324/142 X |
| 4,365,302 | 12/1982 | Elms | 364/483 |
| 4,400,783 | 8/1983 | Locke, Jr. et al. | 364/483 |
| 4,408,283 | 10/1983 | Kovalchik et al. | 324/142 X |
| 4,418,333 | 11/1983 | Schwarzbach et al. | 340/310 A |
| 4,442,492 | 4/1984 | Karlsson et al. | 324/142 X |

OTHER PUBLICATIONS

D. Scott, *Popular Science*, vol. 223, Sep. 1983 pp. 22, 24.

*Primary Examiner*—Parshotam S. Lall
*Assistant Examiner*—Edward Cosimono
*Attorney, Agent, or Firm*—Pennie & Edmonds

[57] ABSTRACT

A method and apparatus are disclosed for sensing, sampling and performing calculations on a parameter of a physical quantity at a plurality of remote locations comprising a plurality of remote sensing units and at least one processing unit linked to said plurality of remote sensing units via a two way communication link. Parameters of a physical quantity are sensed and sampled, calculations are performed and accumulated and transmitted, on demand, provided to the processing unit using a plurality of frequency bands one of which is identified as having valid data.

16 Claims, 40 Drawing Sheets

METHOD AND APPARATUS FOR REMOTE MEASUREMENT

This is a continuation of application Ser. No. 560,068, filed Dec. 9, 1983 now abandoned.

BACKGROUND OF THE INVENTION

This invention relates to a method and apparatus for remote metering particularly suited for metering electrical energy.

Because of the drastic increase in energy costs in the past ten years, it has become increasingly more desirable to make efficient use of available energy and the plant that is used to produce it. Individual accountability for energy consumption has proven to be a powerful incentive to energy conservation, leading to increasing demands for individual metering of the energy consumption of each individual entity where some form of master metering might previously have been used. Thus, instead of accepting a percentage share of the electric bill derived from a master meter in an office building or condominium, tenants are increasingly demanding individual metering of their own electrical energy usage. Individual metering rewards those tenants who practice conservation by allocating to them only their actual energy costs. It is advantageous to the landlord because it transfers to the tenant resonsibility for costs that tend to rise faster than the rent and over which the landlord has no control. Perhaps most important, to the electric utility and the community, individual metering means more efficient use of existing generating capacity and therefore at least some respite in the struggle over where to locate and how to finance additional capacity.

While there are substantial incentives for individual metering, the conventional electromechanical meters are not an adequate solution. These devices must be read manually, requiring a large labor force and imposing a difficult problem in where to locate them. As will be appreciated, the location problem is particularly acute when individual meters are to be retrofitted in a building that was formerly master metered. Electromechanical meters also have several inherent problems. They are not very accurate, typically being designed for accuracies of $+0.5\%$ under ideal conditions and $+2\%$ of a specified range; they slow down with age and at low currents produce low readings; they are position and magnetic field sensitive; and their accuracy in monitoring electrical energy consumption by some modern appliances or under transient conditions may be very poor.

Another shortcoming of conventional electromechanical meters is their inability to provide at reasonable expense time-of-day metering so that power companies could charge for power as a function of load factors. Such capability has become increasingly more desirable as a means of distributing load and therefore diminishing the need for more generating capacity.

Numerous techniques have been devised for remote metering. See, for example, U.S. Pat. Nos. 3,153,780, 3,747,068, 3,818,481, 4,004,097, 4,139,735, 4,161,720 and 4,239,940. While numerous techniques have been devised, there are many problems with them. Some techniques require the use of separate communication lines for the meters, while those which use current carrier systems are subject to severe noise problems. Few, if any, take full advantage of the size reductions, accuracy and economy available from digital computer circuitry.

SUMMARY OF THE INVENTION

We have devised a method and apparatus for remote metering that relies on carrier current signalling and makes full use of digital signal processing to improve the accuracy of the metering. In accordance with our invention, the apparatus has three levels of intelligence comprising a central billing computer, one or more communications interface processors (CIP) connected through the phone system to the central billing computer, and one or more remote sensing modules (RSM) located at each site where measurements are to be made. Communications between the RSMs and CIP are by transmission over the AC power lines to which they are connected. Information flows bi-directionally through these three levels of intelligence.

The Central Billing Computer is remotely located from the metering site(s) and is the ultimate point within the system for data processing and back-up storage. It is the point from which individual customer billing is generated. Illustratively, the billing computer consists of a microprocessor with RAM, support circuitry, a floppy disk drive for mass storage, and a modem for telephone-line communications to the multiple CIPs. The interface from microcomputer to modem is standard RS-232, and Frequency Shift Keying (FSK) is used for data communications. At present, a Signalman modem, with a baud rate of 300, is implemented.

The individual CIPs are likewise interfaced to their telephone-line modems by standard RS-232. The CIP consists of a microprocessor with RAM and support circuitry. Its memory is battery-powered to protect against data loss. Through its power line interface, the CIP communicates with, and supervises the functions of, from one to 4096 individual RSMs. For such communications, the CIP uses a 60 baud FSK modem which transmits and receives the signals required for communication over local AC power lines. Six possible channels are available for data communication, each of which carries the same data.

The RSM is a metering device placed within the dwelling or business of the individual customer. Like the CIP and the billing computer, the RSM is a stand-alone microcomputer system. It is capable of full operation and data retention even in the event its CIP supervisor should fail. The RSM is capable of gathering various kinds of data regarding electrical energy, gas usage, and other information input through contact closures or electrical pulses, and of storing this information within its own non-volatile memory.

In normal operation, the RSM is constantly scanned by its CIP supervisor approximately once every 2N seconds where N is the number of RSM's under control of a particular CIP supervisor and two seconds is the approximate time to scan one RSM. The CIP condenses and analyzes data received from its RSM network and stores it in battery-powered CMOS RAM. This data includes bit-error rate, energy demand, and time-of-day information. In the event of RSM failure, the data the CIP has previously gathered is available, in condensed form, to the central billing computer. RSM failure or malfunction is recognized by the CIP within one scanning interval. Worst-case data loss, therefore, is determined by the speed of RSM replacement.

The CIP's data store is accessed once daily by the central billing computer, which then replicates the metering information into its own back-up archives. In the event of a CIP and an RSM failing in tandem, the Central Computer can be no more than one day behind in its collection of system data, but the techniques of multiple redundant storage outlined above significantly limit data loss and the corresponding loss of revenue involved in metering operations.

The RSM comprises sensors for reading parameters such as current and voltage which are used in measuring energy transmission, sampling means for sampling these parameters and digitizing them, means for calculating energy transmission from the sampled values, an accumulator for accumulating the calculated value and a communication system for transmitting the accumulated values to the CIP.

The RSM is an individual microcomputer-driven, electronic meter having the capability of standard KWH reading as well as time of day metering.

The meter is a "stand-alone," independent unit with full data processing and data retention capability. In the event of power failure, data presently being accumulated is stored in a non-volatile memory, thus preserving data integrity and guarding against data and revenue loss. The meter has full capability for data communications to the CIP by means of frequency-shift keying (FSK)/power-line carrier (PLC) techniques. Data communications are further enhanced by multi-channel communication techniques, whereby the meter receives the same signals over six distinct channels, uses a valid data check to test the received signals to locate an interference free channel and transmits data back to the CIP over the first such channel it locates. This provision guards against errors caused by both random interference common to AC power lines as well as any intentional interference.

The metering itself is accomplished through a special sampled system, where hardware and software error correction features interact to produce high-precision readings (less than 1% errors). Preferably, this sampling system involves separate voltage and current signals being sampled at a given rate and then multiplied and summed to yield power and energy readings. Any system offset present is minimized by dynamic offset-cancelling.

The design of the meter also provides safeguards against a number of problems inherent in such technology.

1. Random transient malfunction, resulting in program "derailment" is a characteristic of microprocessors. To protect against this contingency, special circuitry is resident in the meter which monitors the stability of the meter's central processing unit and resets it should instability be detected. In this way, meter processing continues uninterrupted, and no manual reset of the unit is required.

2. The meter also has the capability of detecting power failure in its incipient stage and storing its data in non-volatile memory before full power loss is experienced. When power is restored, recall of the stored data is automatic and the meter resumes operation immediately.

3. Access to data being stored in RAM is guarded by special gating circuitry which prevents data loss due to transient malfunction.

4. Current inputs tapped from building power lines are stepped-down and isolated by special transformers. The nominal error of the transformer type is compensated for through the meter firmware. If required, the actual characteristics of the individual transformer used may be compensated for through software.

A BRIEF DESCRIPTION OF THE DRAWINGS

These and other objects, features and advantages of our invention will be more readily apparent from the following detailed description of a preferred embodiment of the invention in which.

Figure 16A:
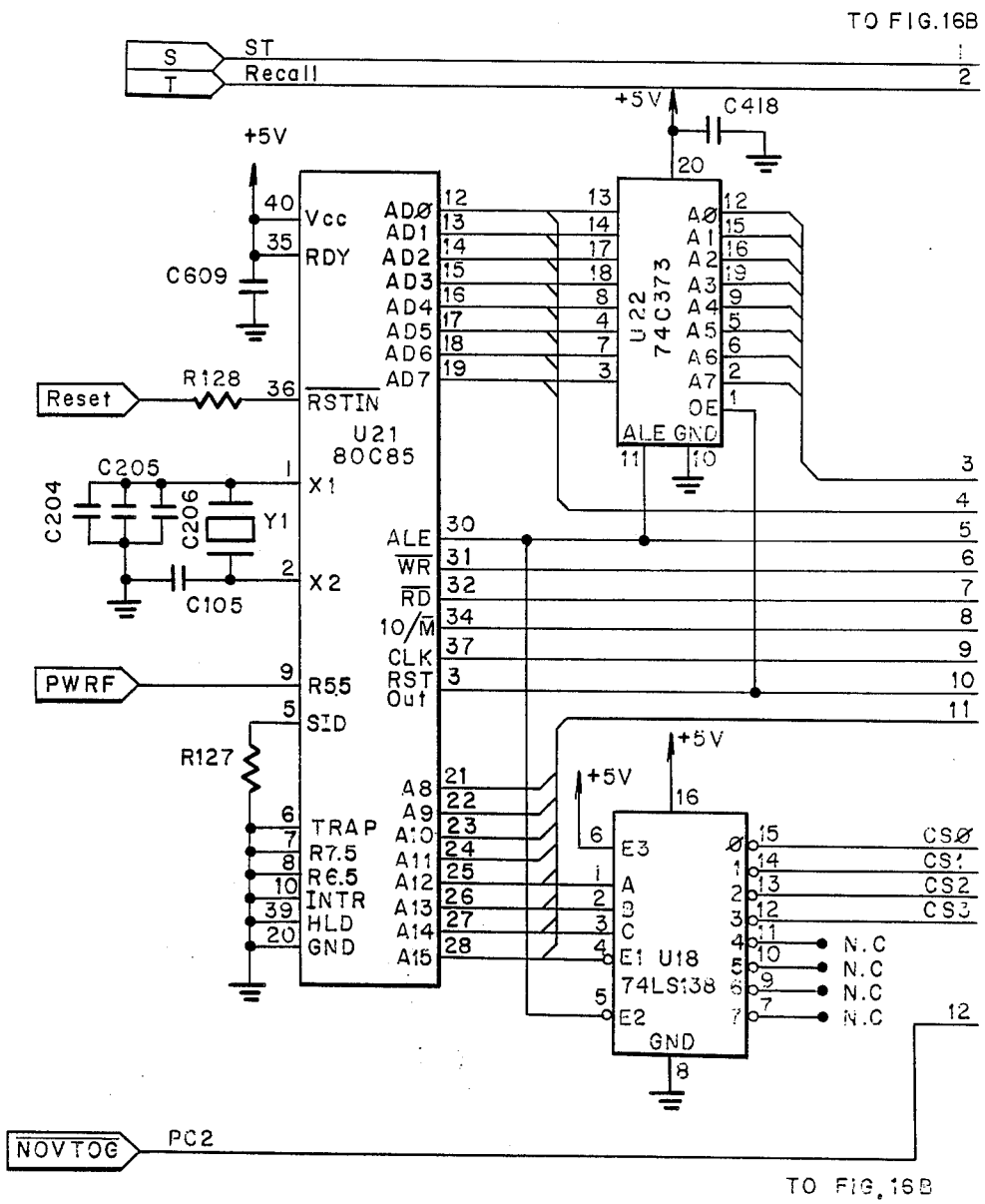
Figure 17A:
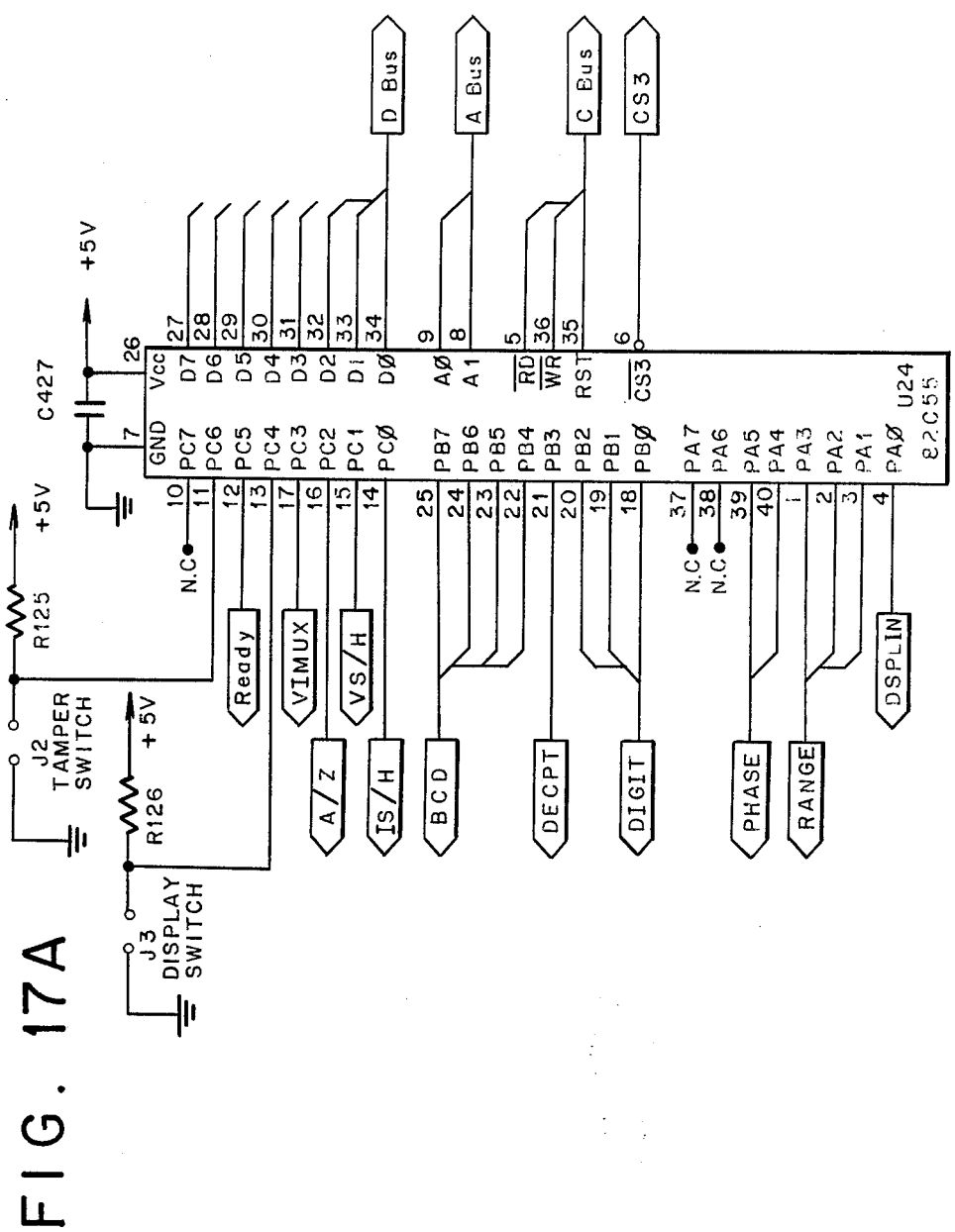
Figure 18:
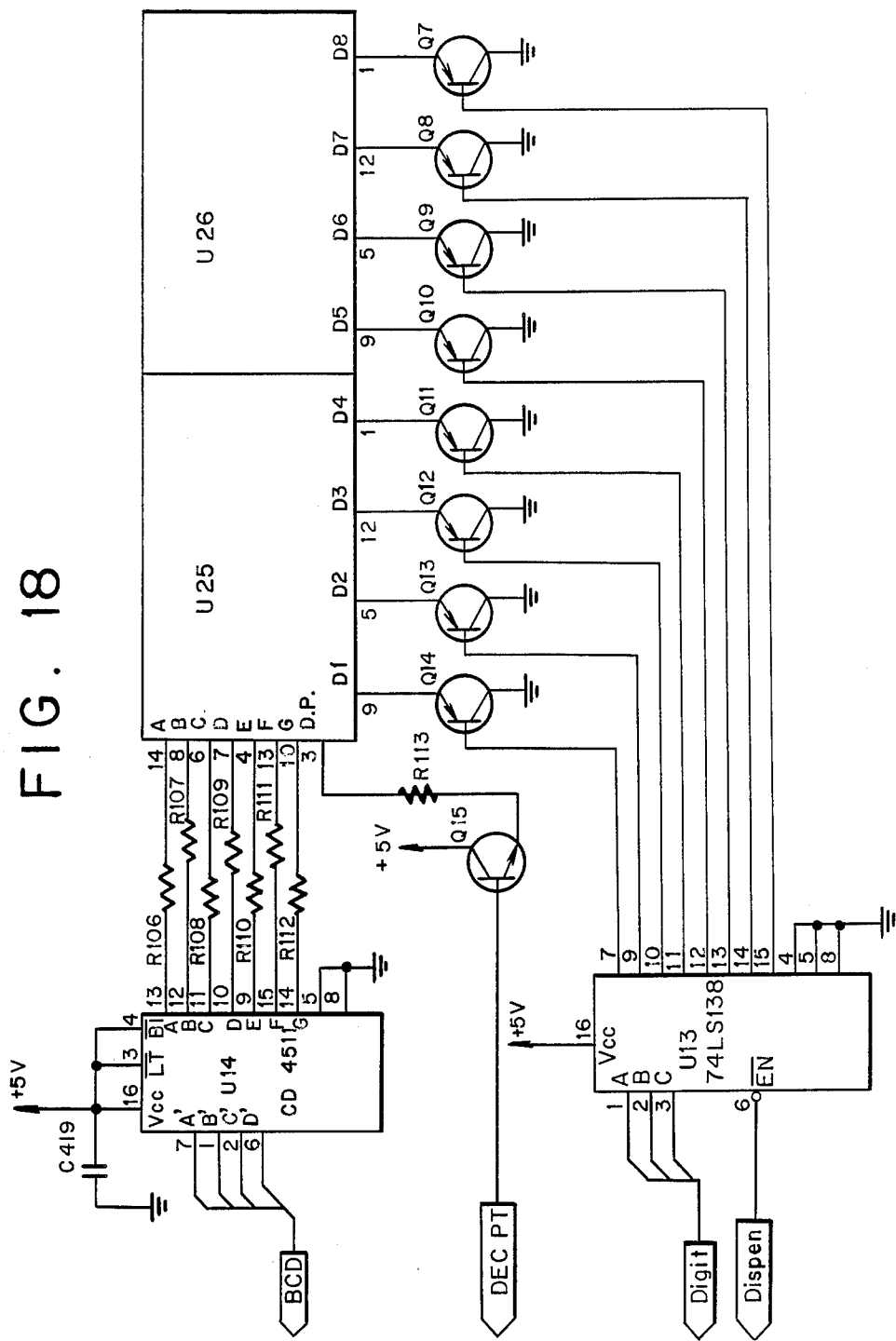

FIGS. 16A, B are schematic diagrams of a central processing unit of the RSM unit;

FIGS. 17A, B are schematic diagrams of an illustrative embodiment of two programmable Input/Output interfaces for the RSM unit;

FIG. 18 is a schematic diagram of a meter display section for the RSM unit.

Figure 19:
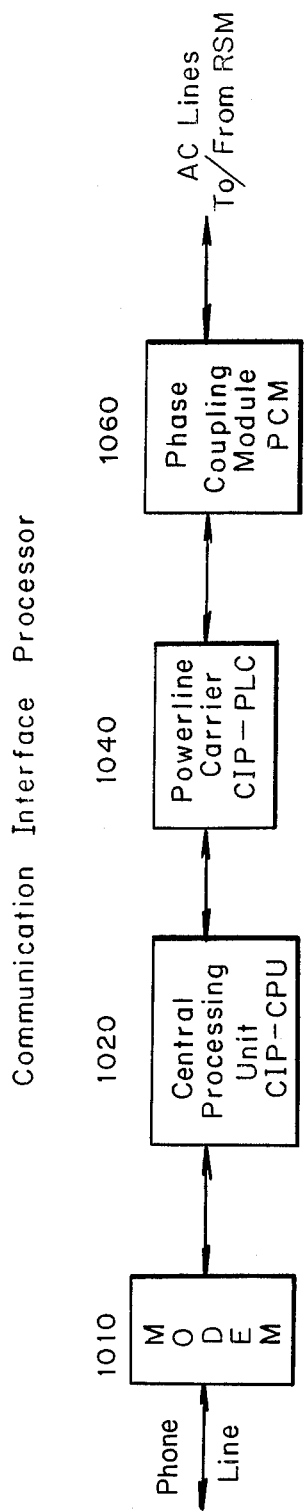

FIG. 19 is a block diagram of the Communications Interface Processor (CIP).

Figure 20:
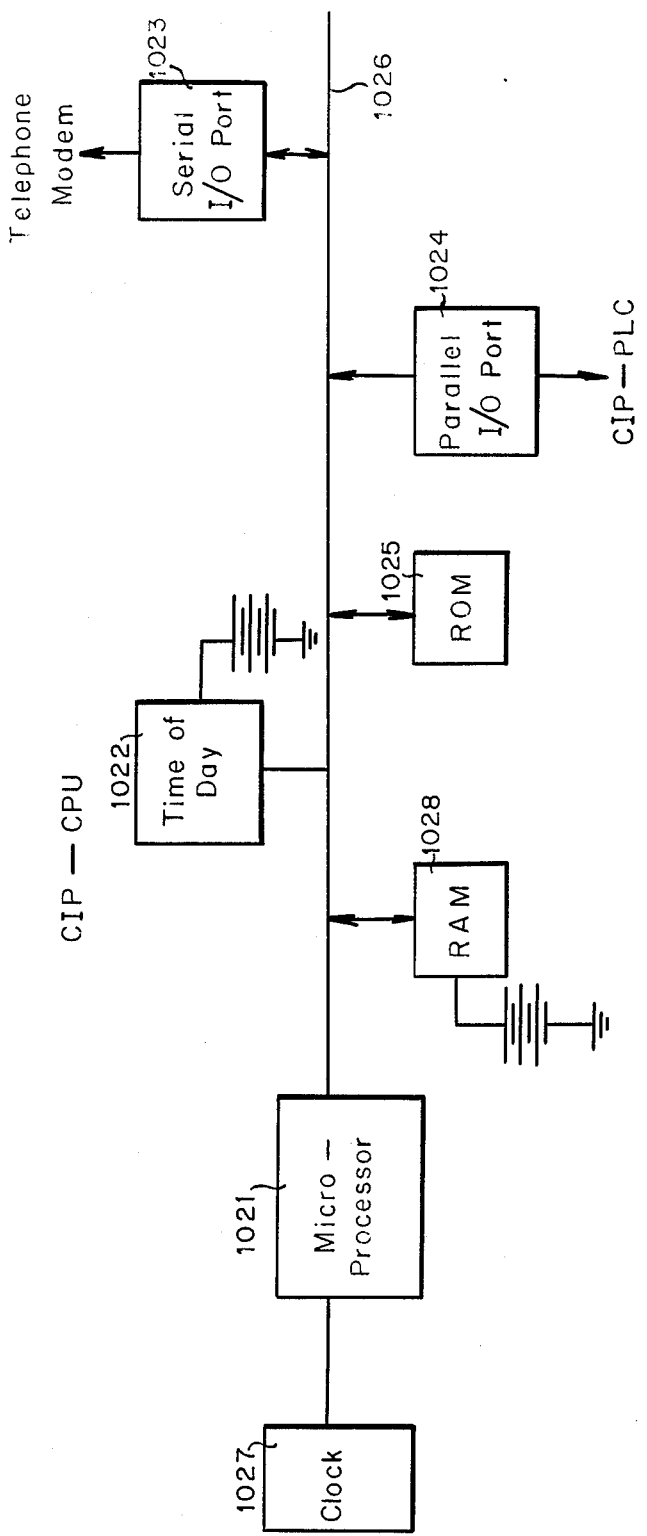

FIG. 20 is a block diagram of the Central Processing Unit of the Communications Interface Processor (CIP-CPU).

Figure 21:
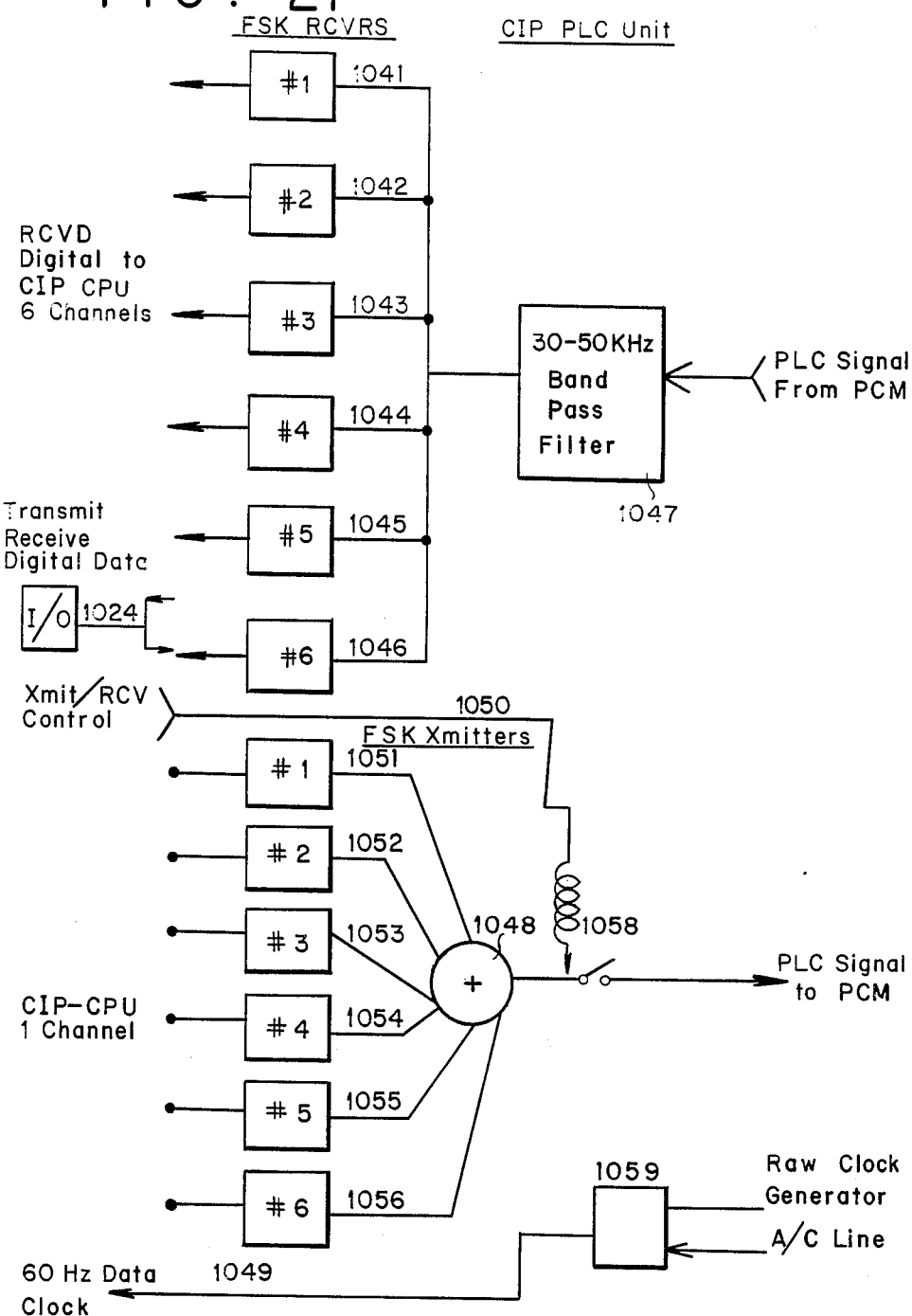

FIG. 21 is a block diagram of the Power Line Carrier unit of the Communications Interface Processor.

Figure 22:
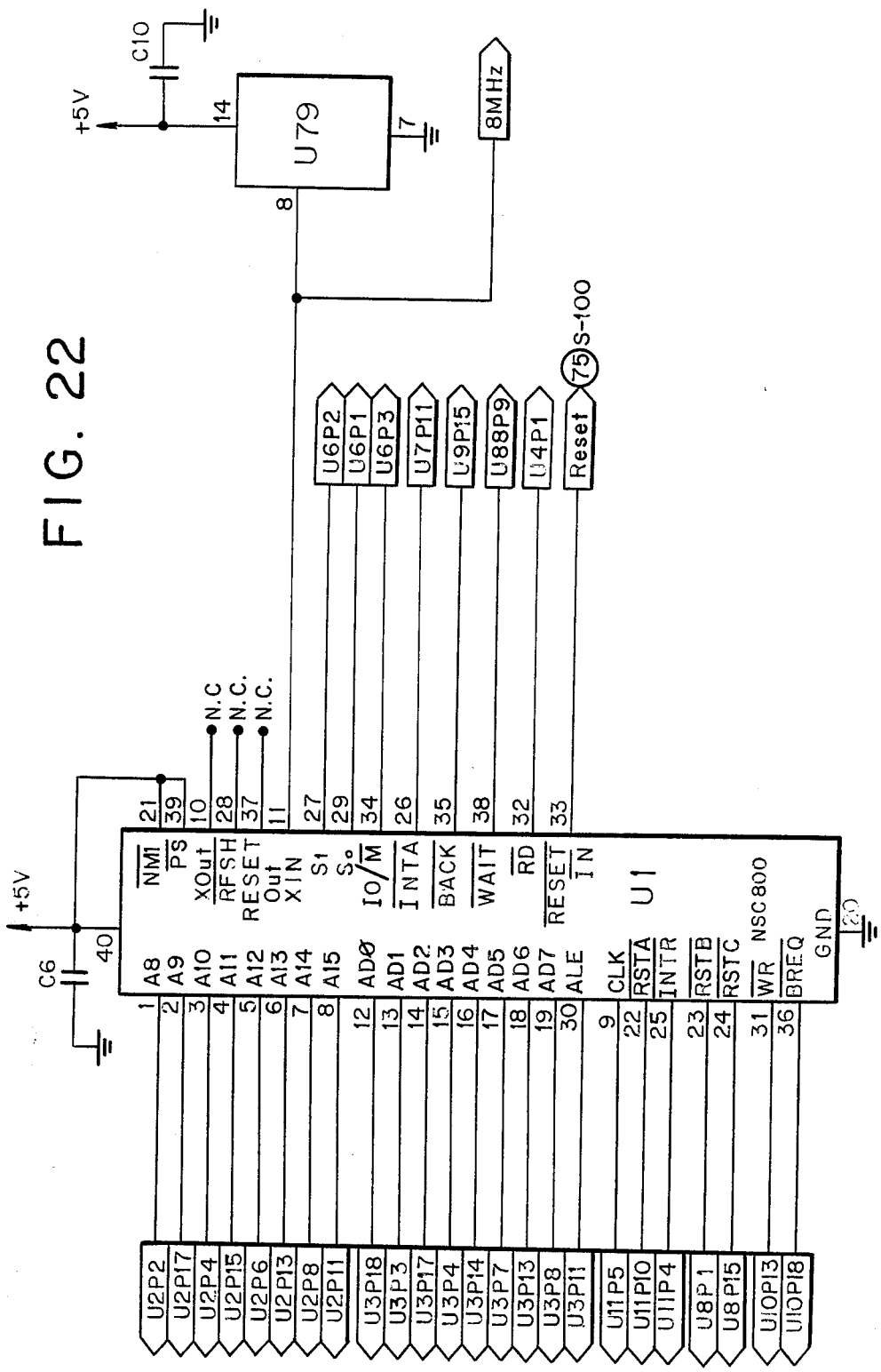

FIG. 22 is a schematic diagram of the Master CPU and Clock of the Communications Interface Processor.

Figure 23:
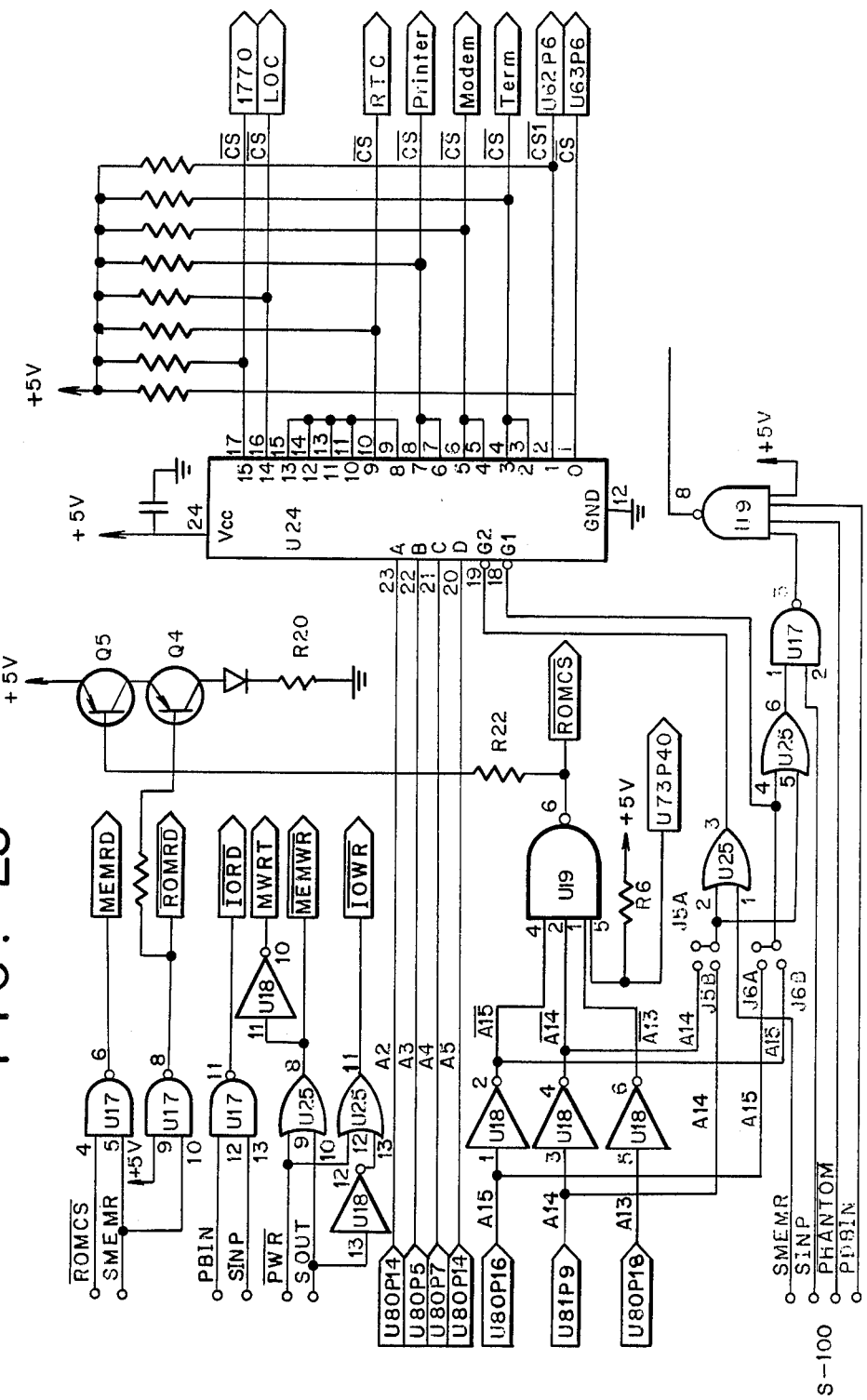

FIG. 23 is a schematic diagram of the Decoding Circuitry of the Communications Interface Processor.

Figure 24:
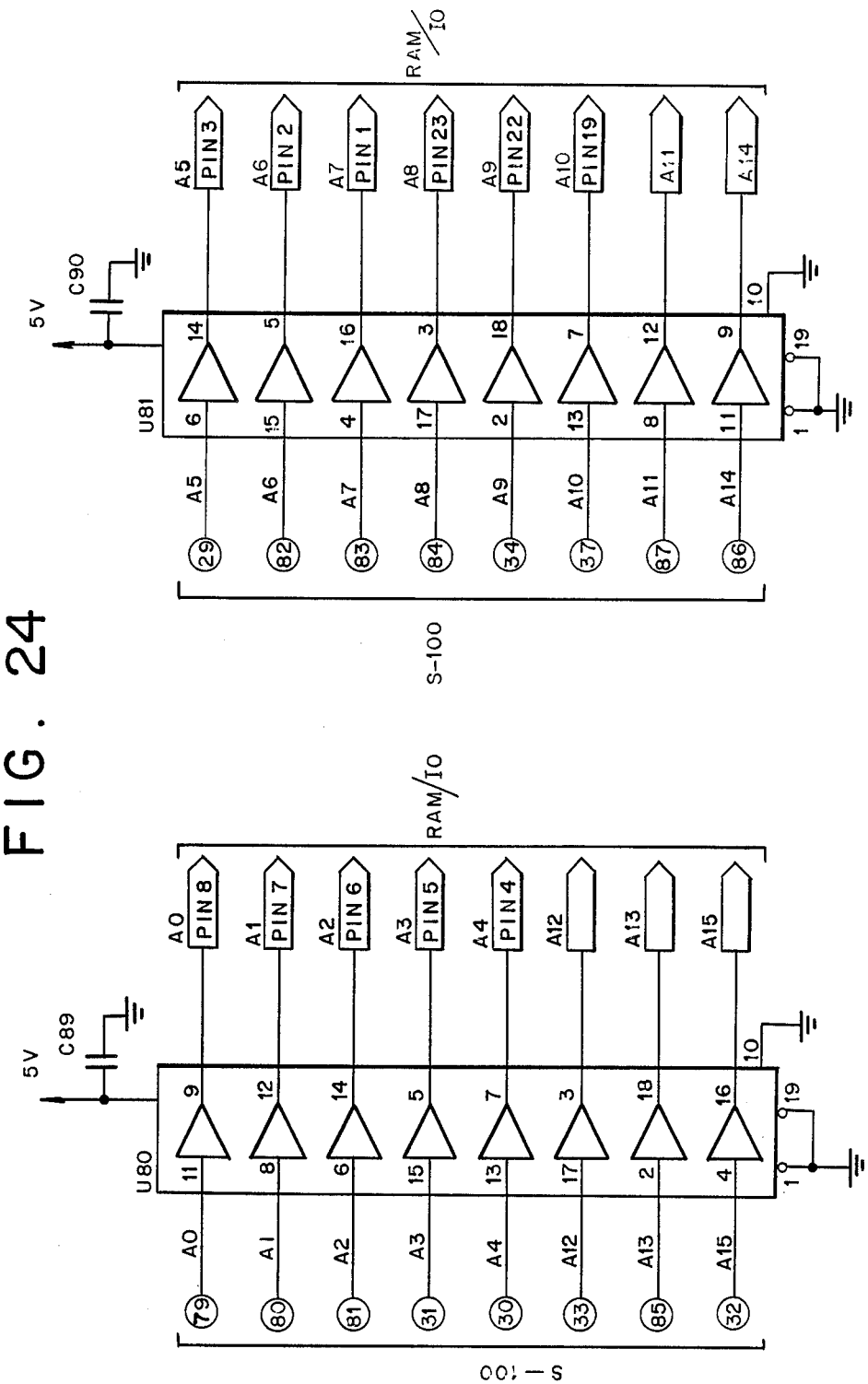

FIG. 24 is a schematic diagram of the Buffer Address Lines to LOC of the Communications Interface Processor.

Figure 25A:
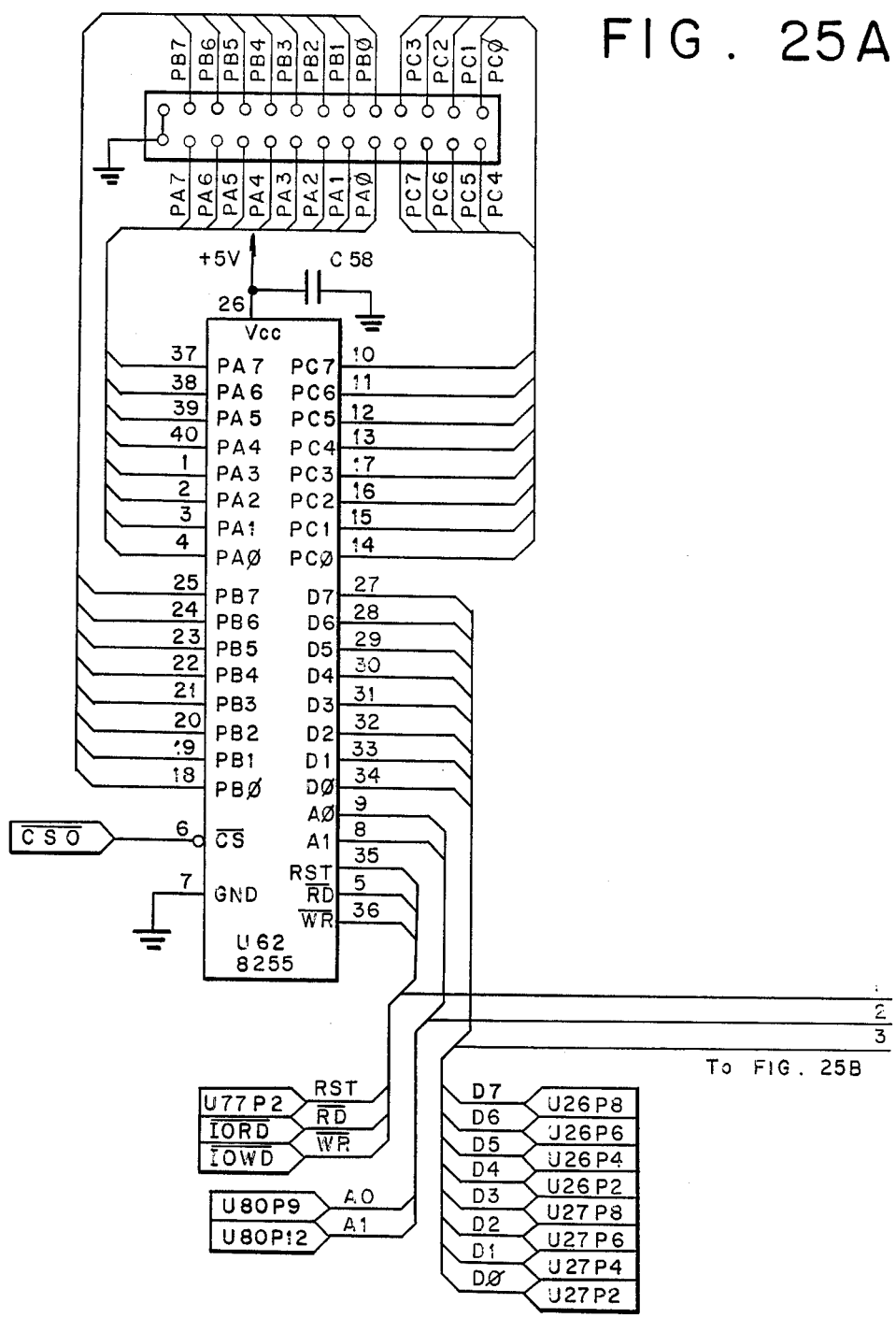
Figure 25B:
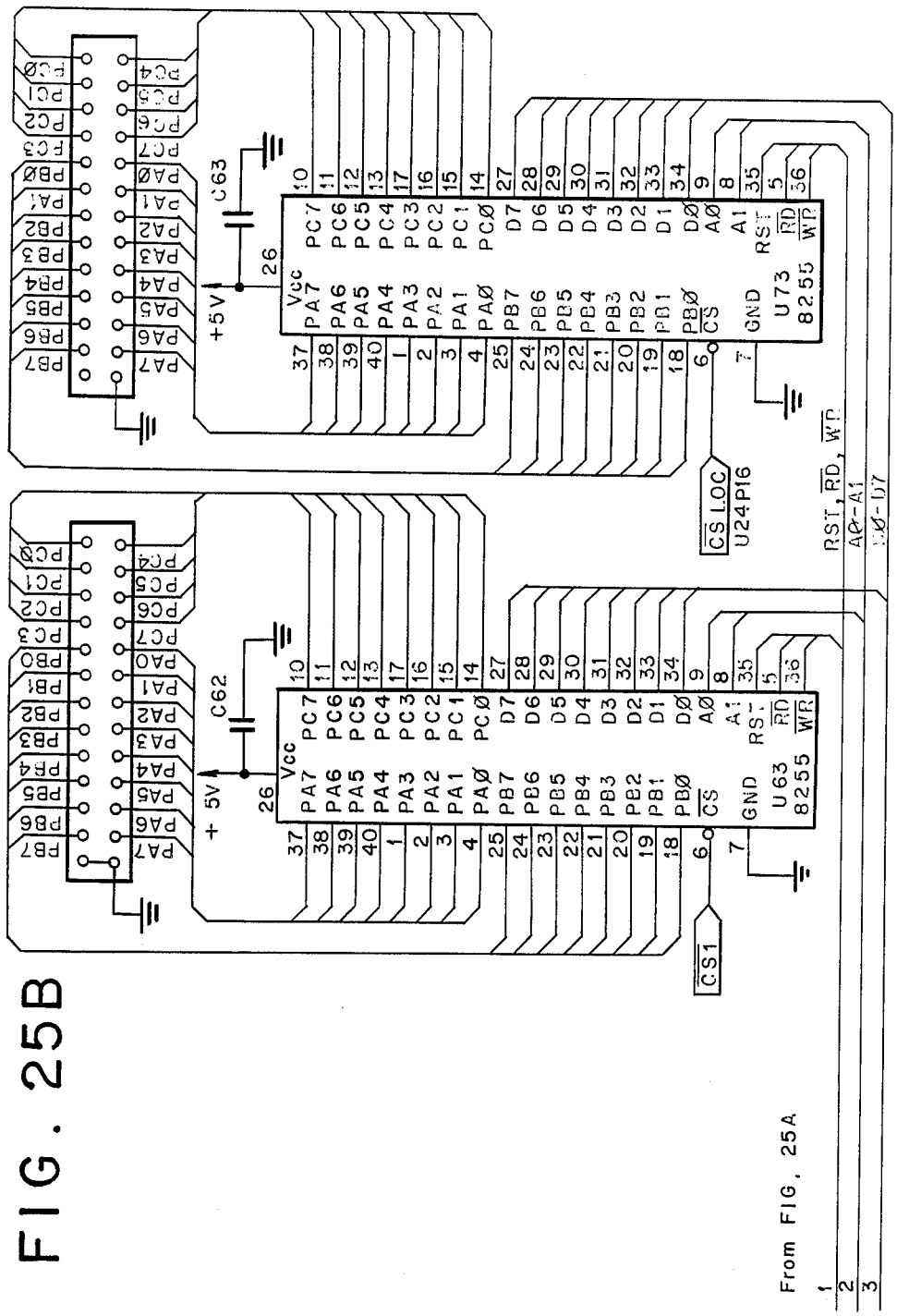

FIGS. 25A, B are schematic diagrams of the Parallel Input/Output (I/O) of the Communications Interface Processor.

Figure 26:
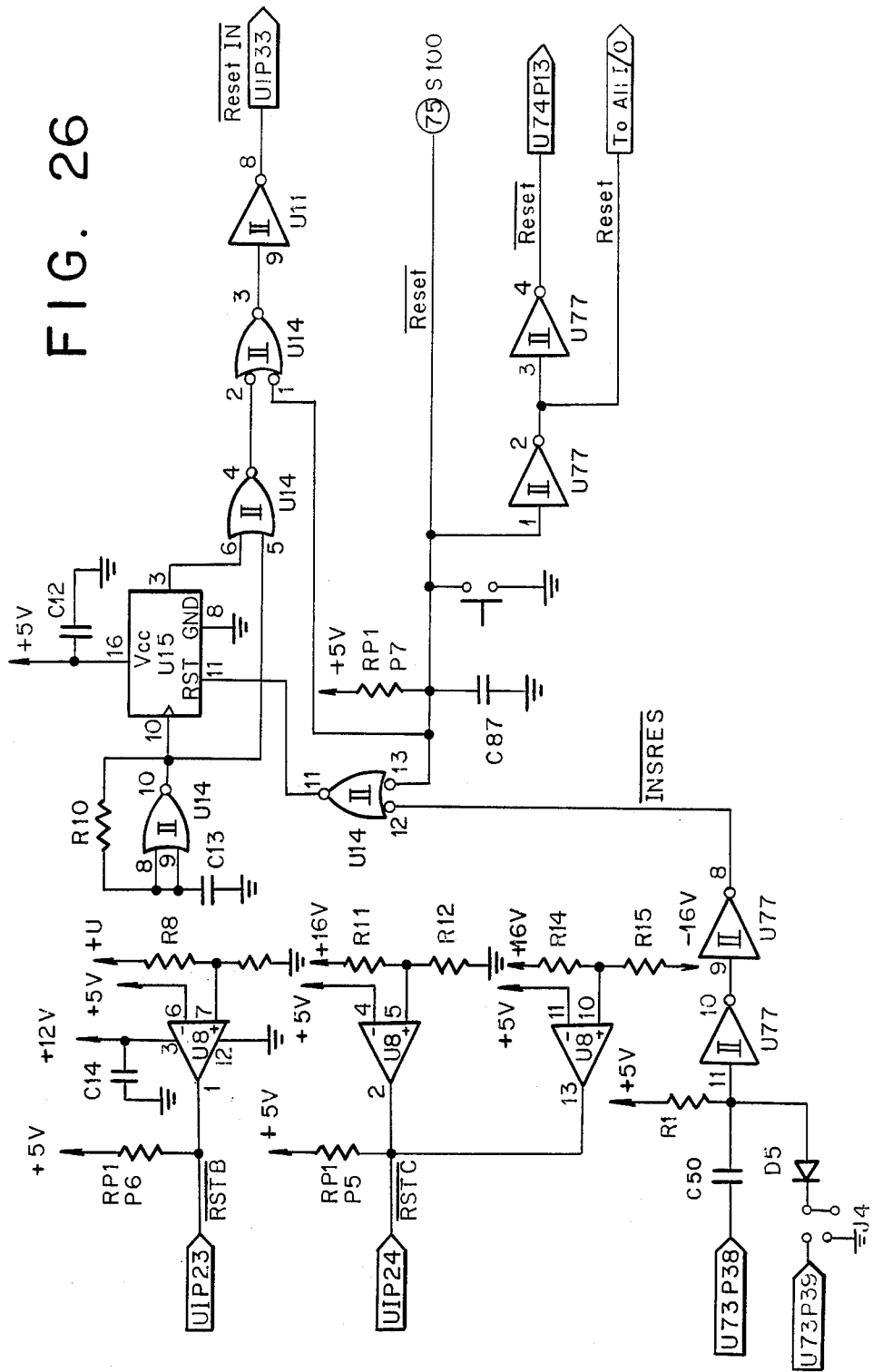

FIG. 26 is a schematic diagram of the Insane and Power Fail circuits of the Communications Interface Processor.

Figure 27:
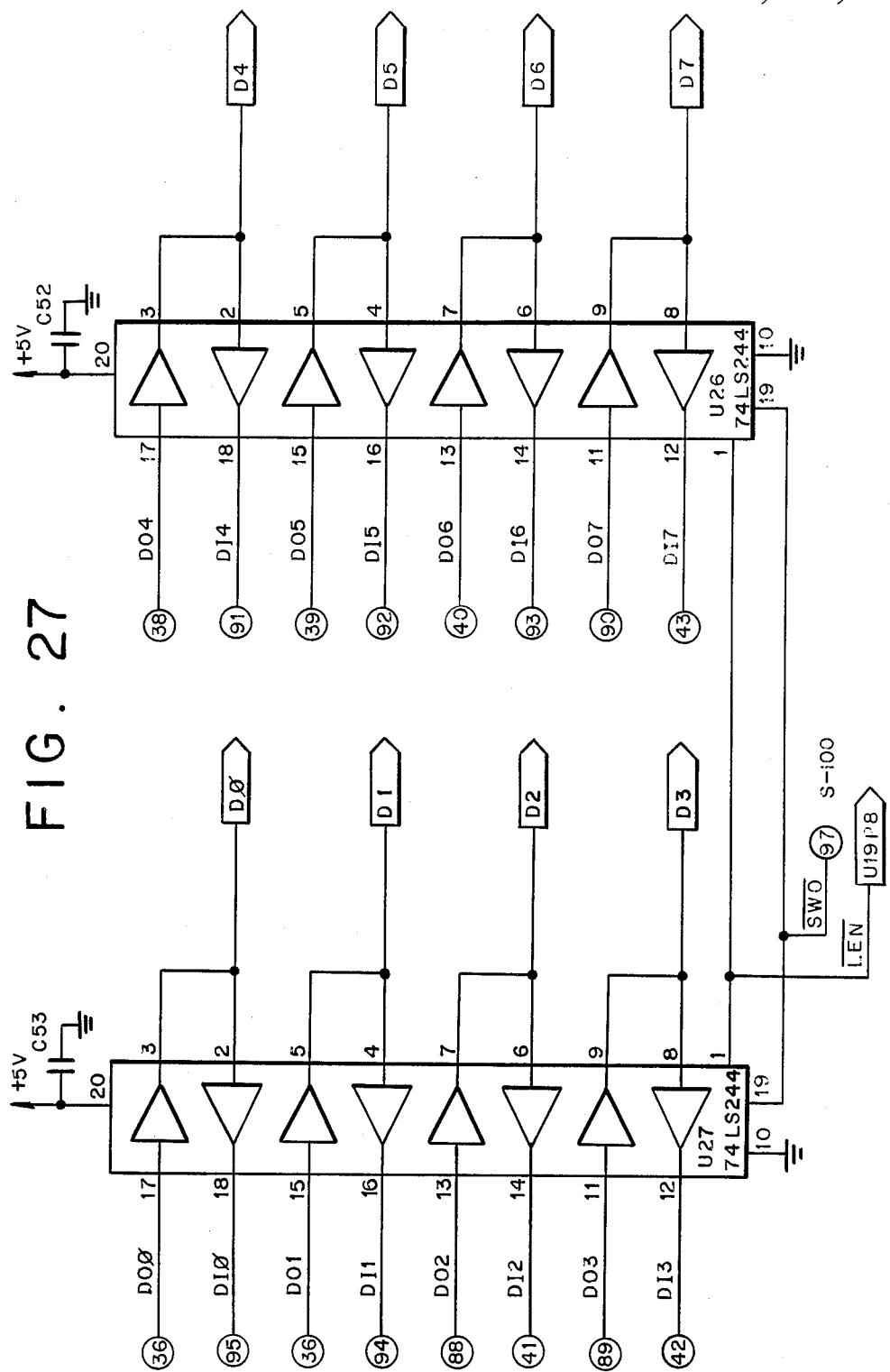
Figure 28:
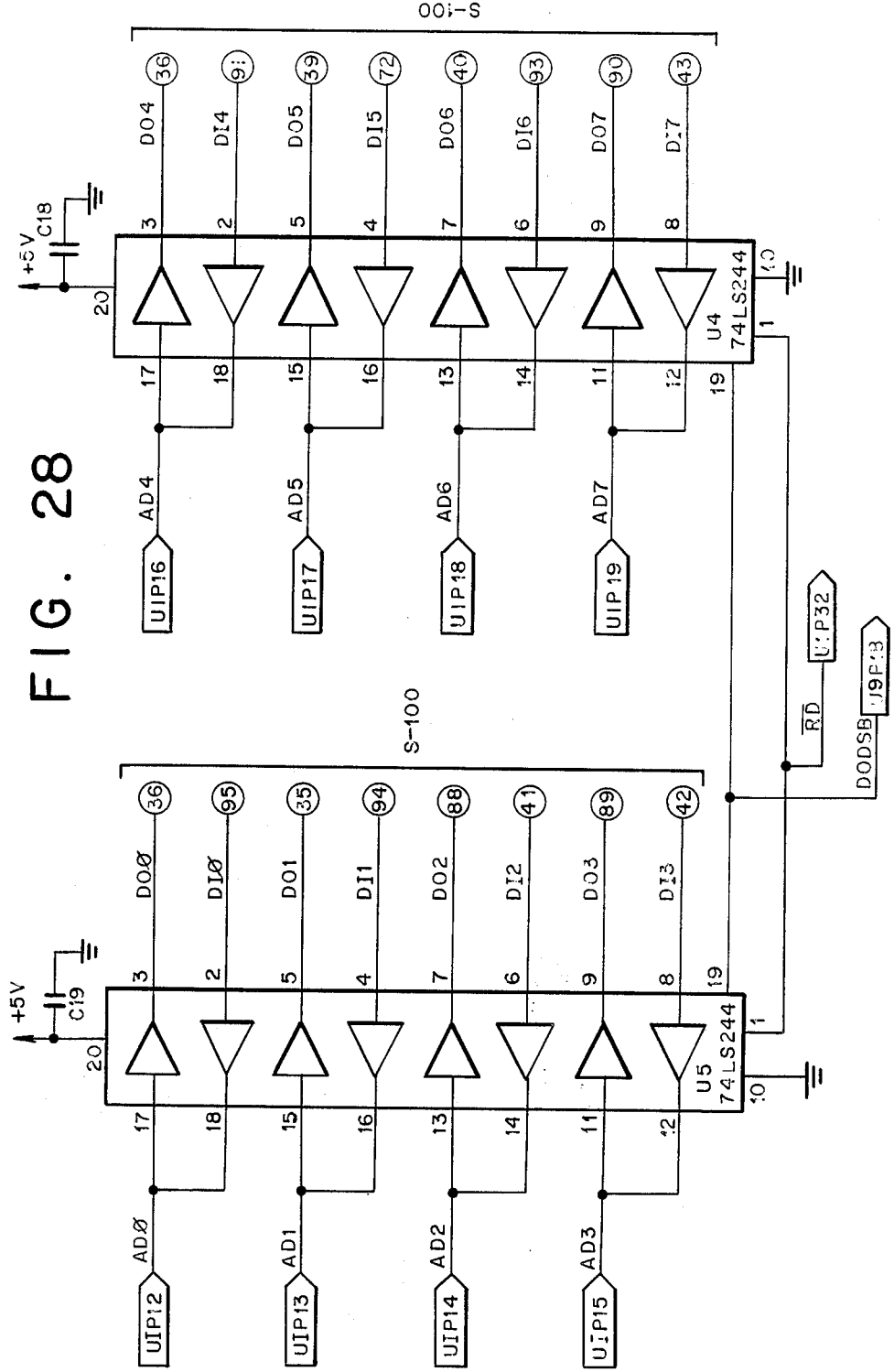

FIGS. 27, 28 are schematic diagrams of the buffer circuitry of the Communications Interface Processor.

Figure 29:
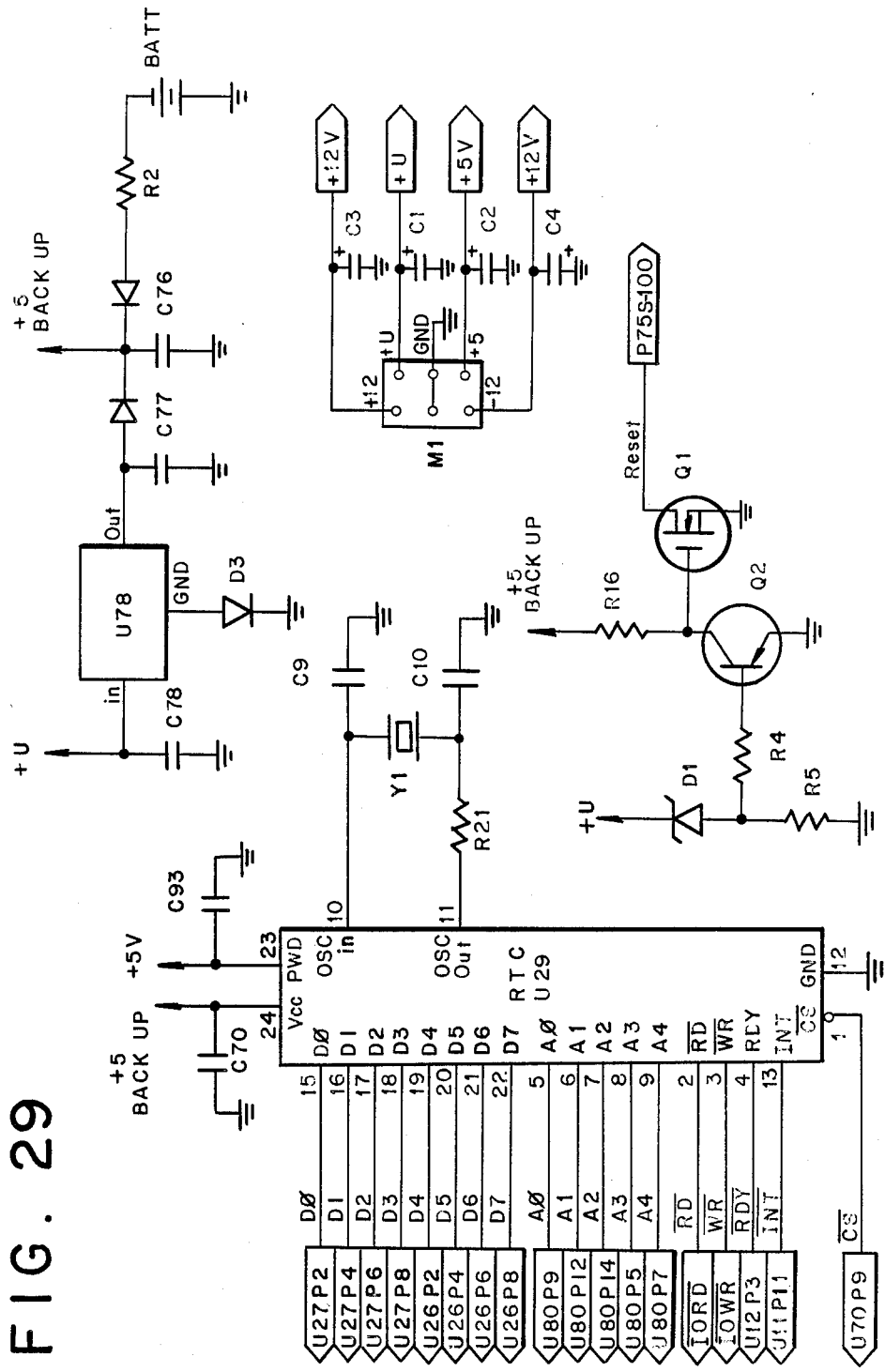

FIG. 29 is a schematic diagram of the Clock Back Up Circuit of the Communications Interface Processor.

Figure 30A:
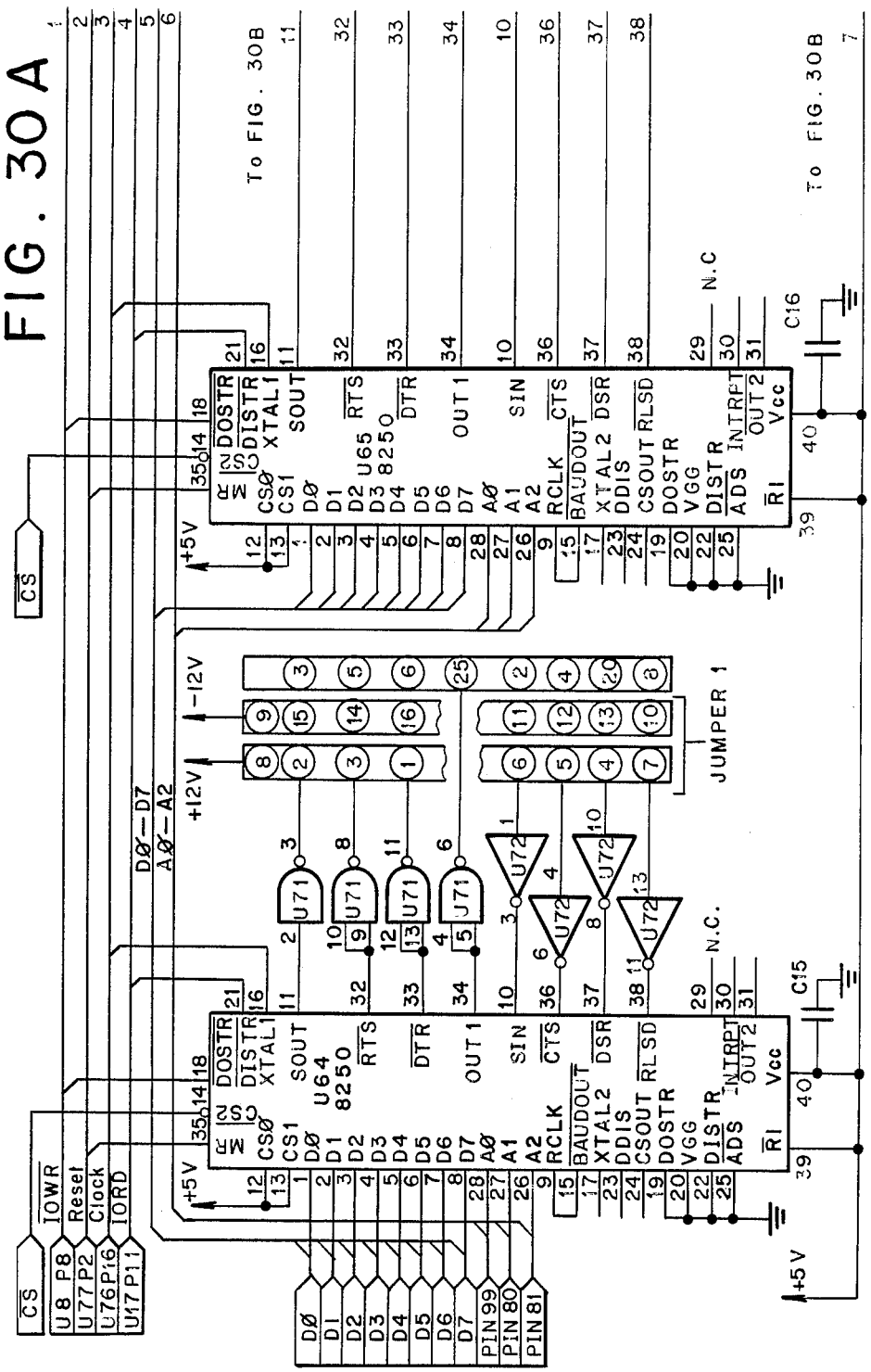

FIGS. 30A, B are schematic diagrams of the Serial Interface Ports and RS232 Buffers of the Communications Interface Processor.

Figure 31A:
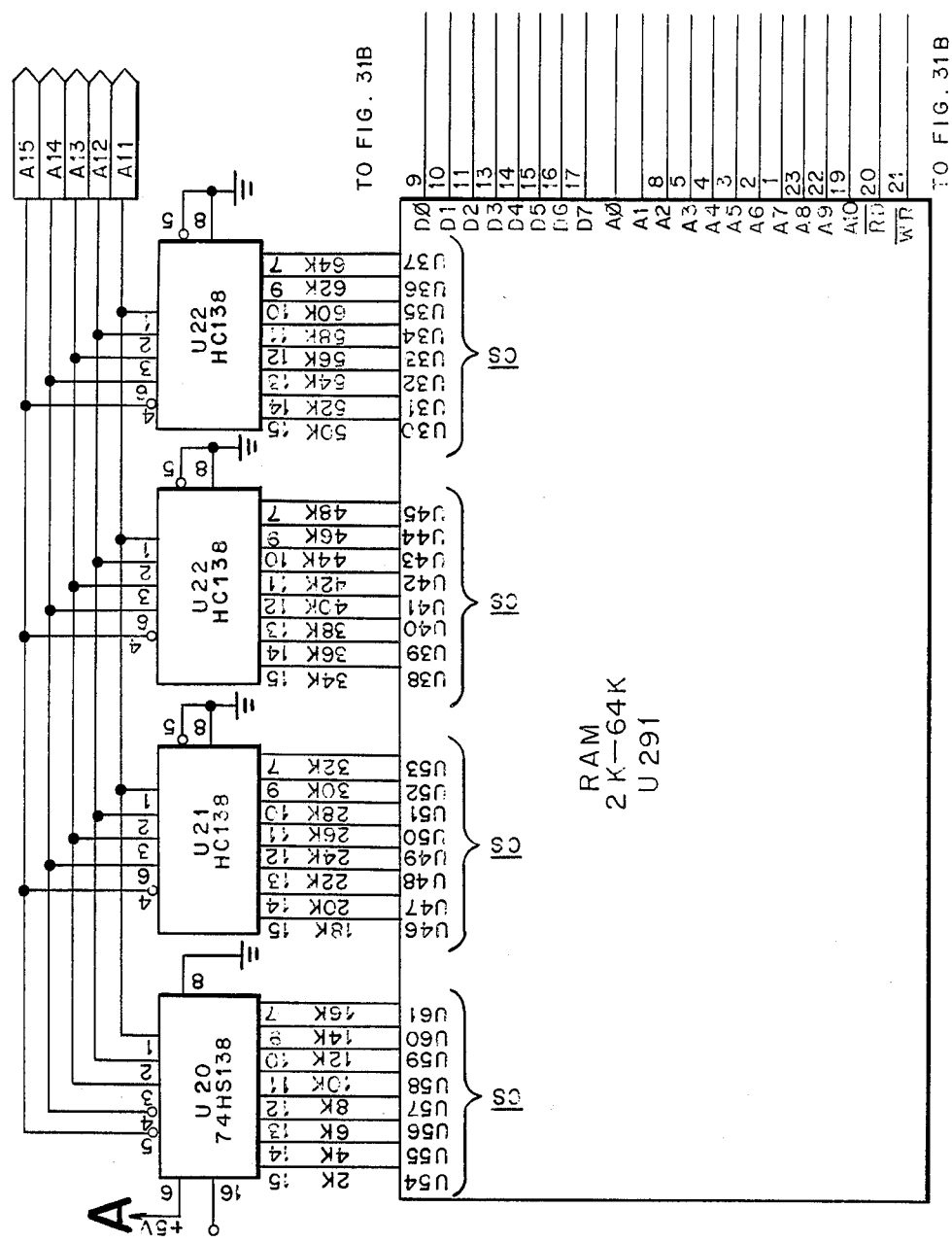

FIGS. 31A, B are schematic diagrams of the Input-/Output (I/O), Random Access Memory (RAM) and Read Only Memory (ROM) and Data Bus circuitry of the Communications Interface Processor.

Figure 32:
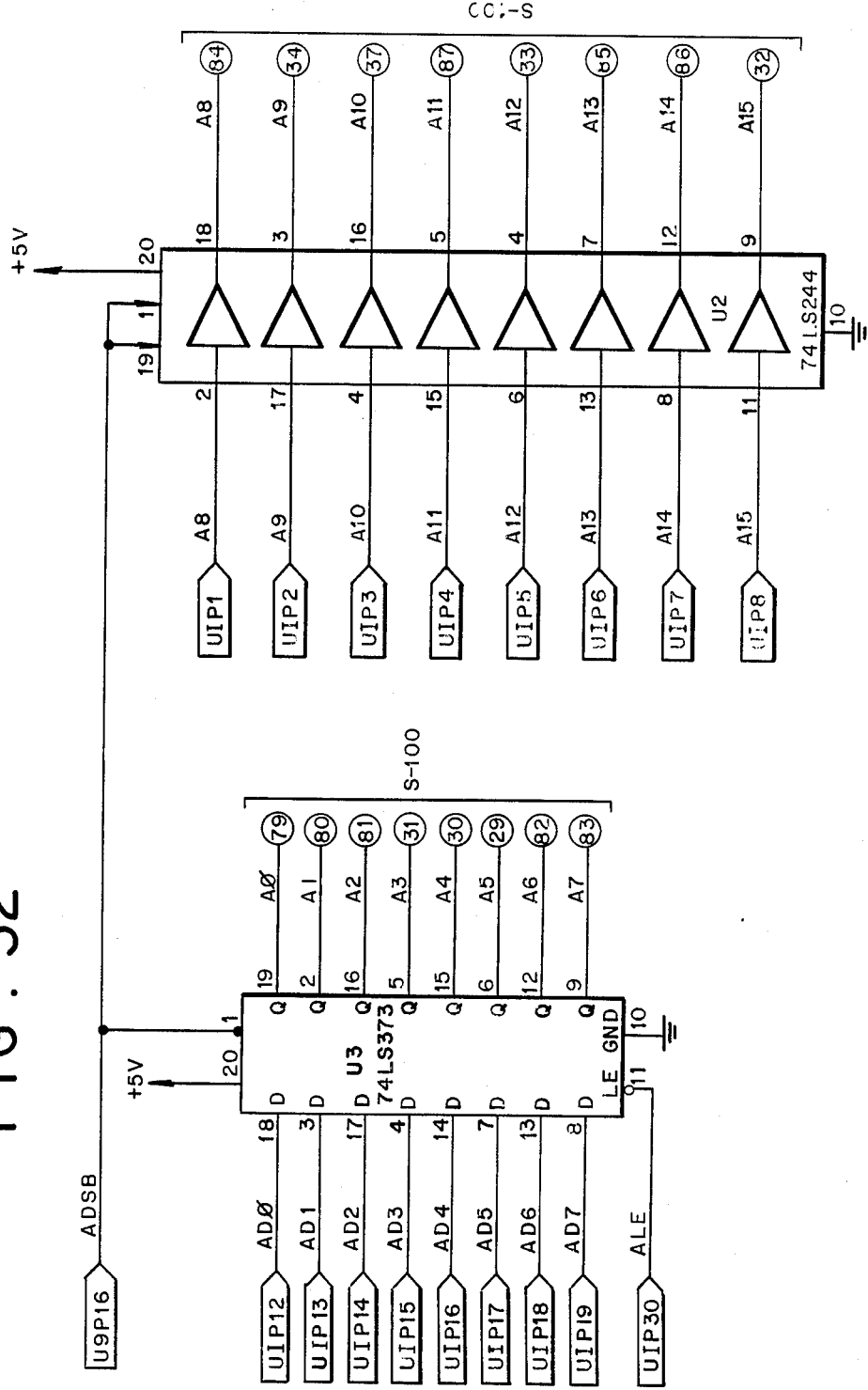

FIG. 32 is a schematic diagram of the Master Address Bus of the Communications Interface Processor.

Figure 33:
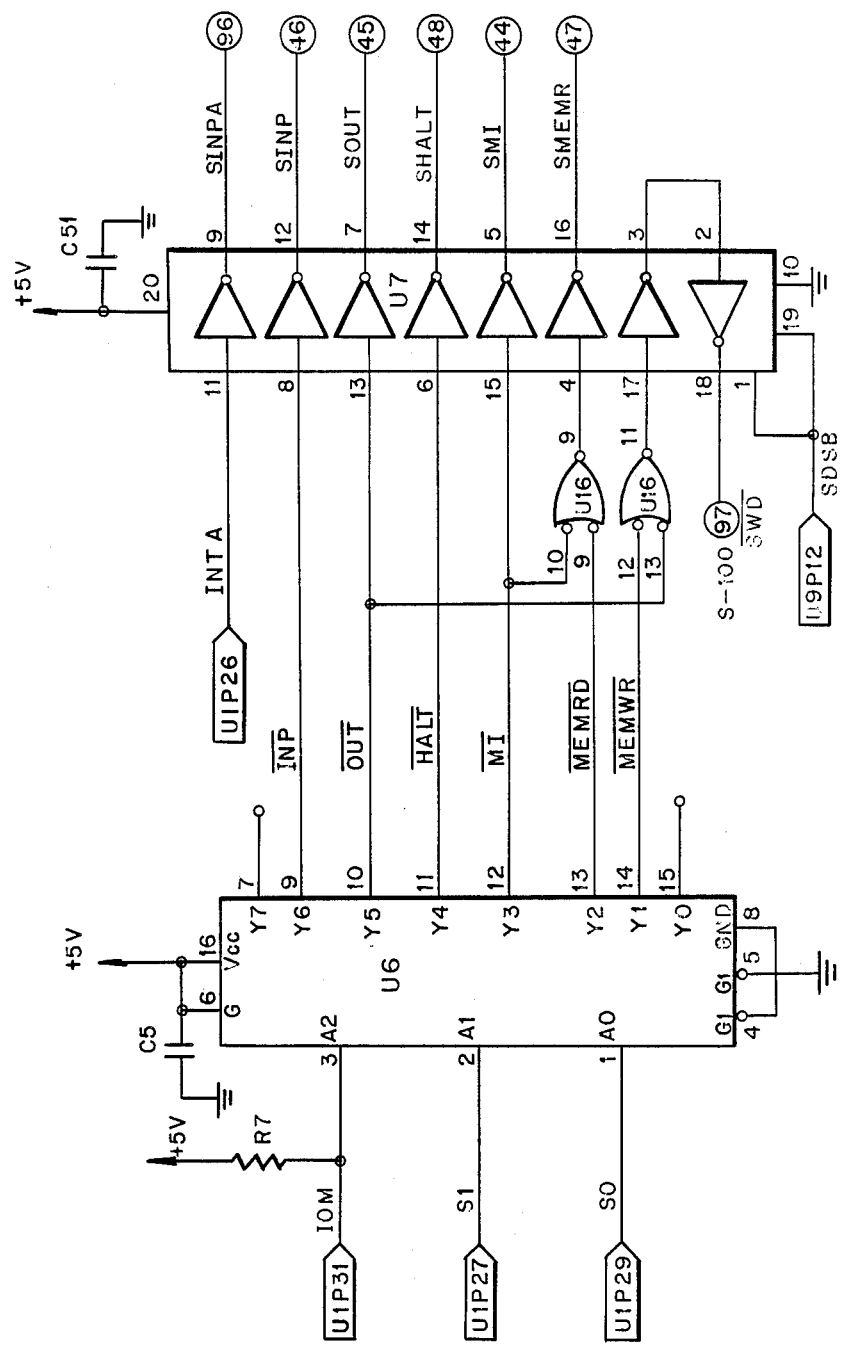

FIG. 33 is a schematic diagram of the Master Status circuitry of the Communications Interface Processor.

Figure 34:
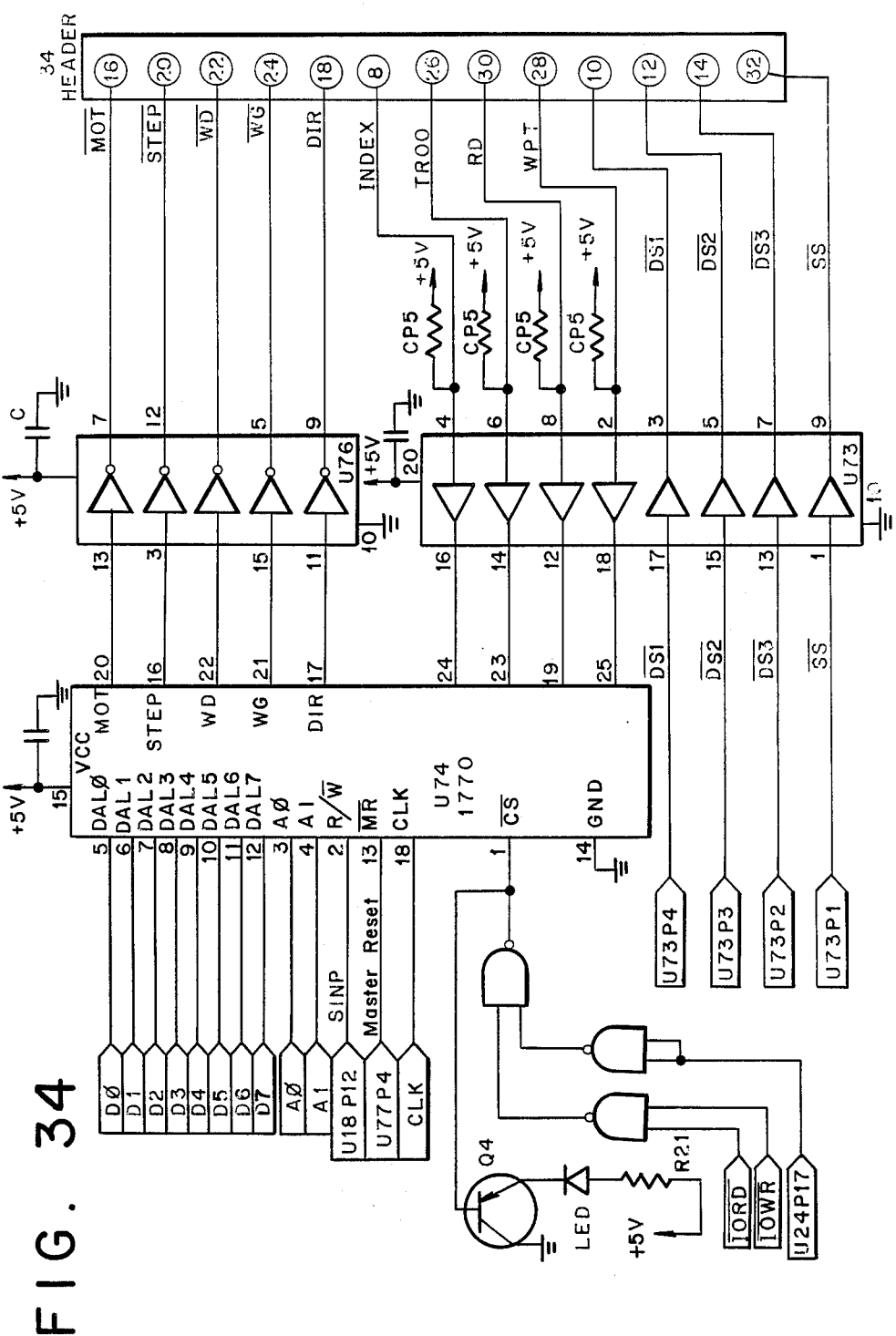

FIG. 34 is a schematic diagram of the Disk Controller circuits of the Communications Interface Processor.

Figure 35:
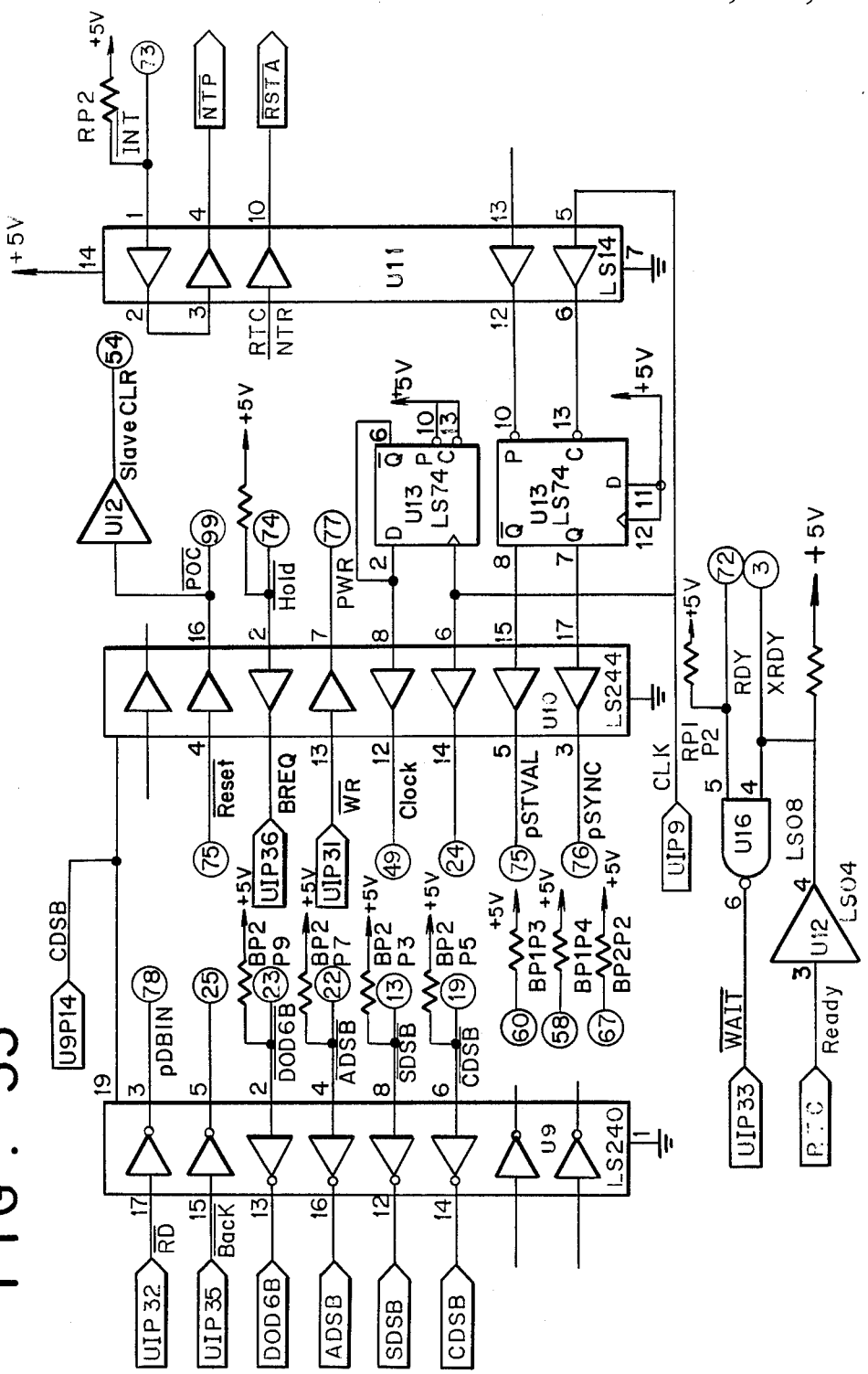

FIG. 35 is a schematic diagram of the Master Control and Utility circuitry of the Communications Interface Processor.

DESCRIPTION OF PREFERRED EMBODIMENT

Figure 1:
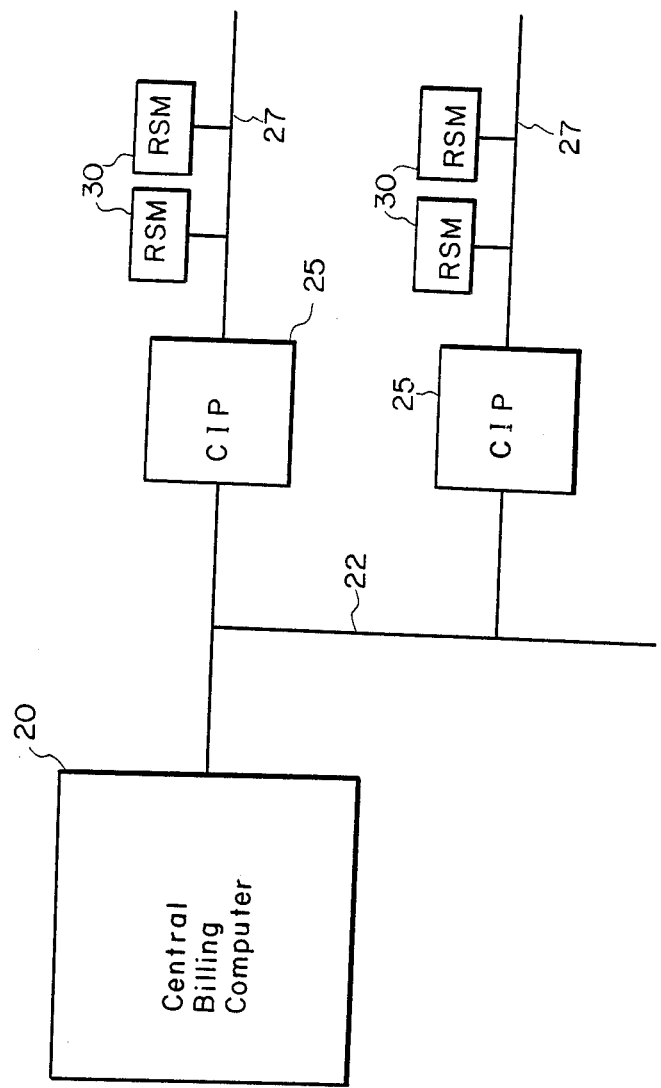
FIG. 1 is a block diagram of the remote metering system of our invention.

As shown in the system block digram of FIG. 1, a preferred embodiment of our invention comprises a central billing computer 20, a plurality of communication interface processors (CIP) 25, and a plurality of remote sensing modules (RSM) 30 connected to each CIP.

In the preferred embodiment of the invention, the system is used to measure electric power consumption on a customer's premises. Accordingly, each RSM is typically located on the customer's premises and the CIP to which it is connected is relatively close by, for example, in the same building.

The central billing computer is connected to each of the CIP's by a conventional data communication system using ordinary telephone lines 22 and readily available modems (not shown). The individual CIP's are connected to the RSM's they service by a carrier current communications system using the electrical power line 27 between the CIP and its RSMs.

Figure 2:
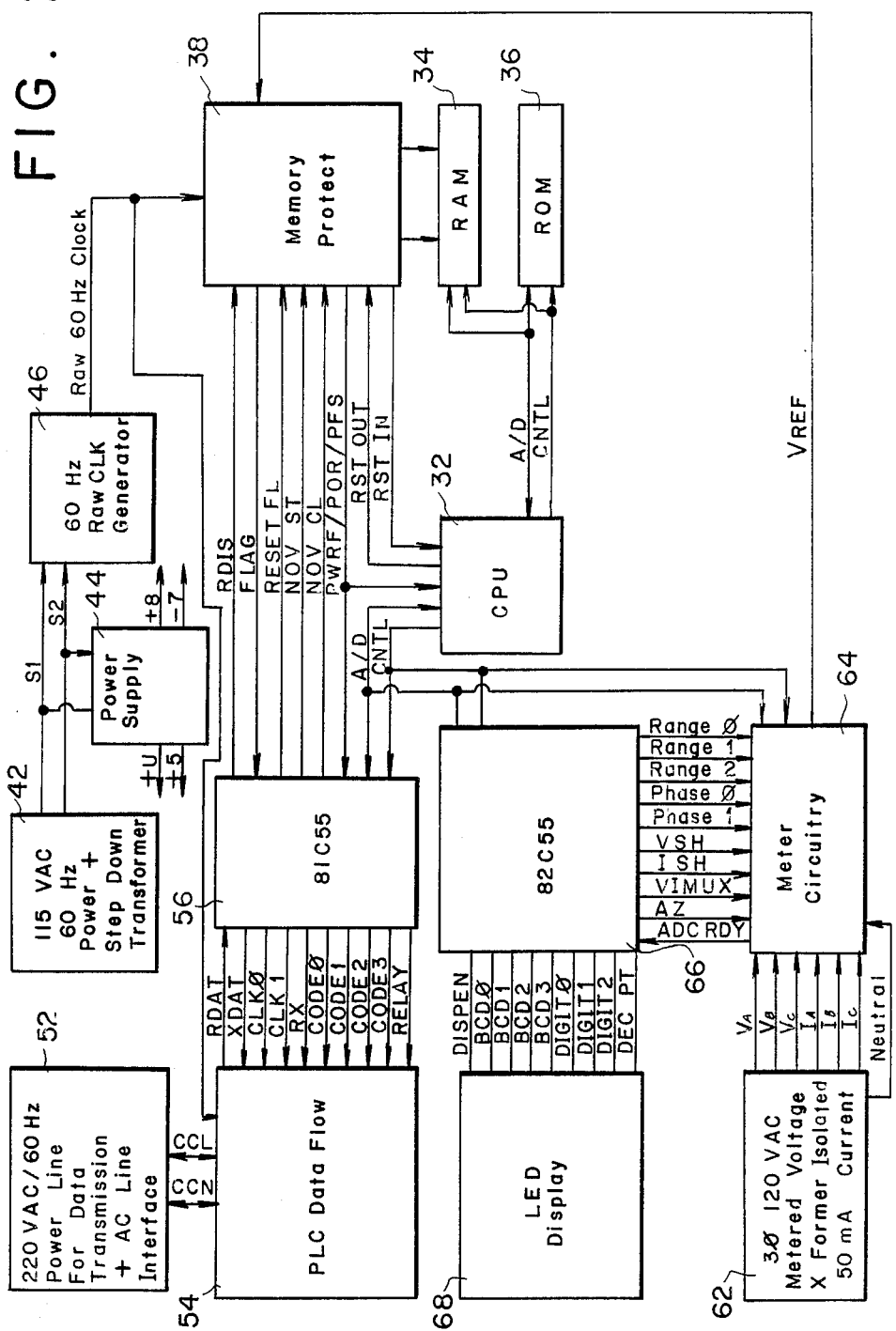
FIG. 2 is a block diagram of an illustrative embodiment of a remote sensing module (RSM) of our invention.

A block diagram illustrating the major components of an RSM is set forth in FIG. 2. As shown therein, the RSM comprises a central processing unit (CPU) 32, a random access memory (RAM) 34, a read only memory (ROM) 36, and a memory protection circuit 38. The RSM further comprises a power line interface and step-down transformer 42, a power supply 44 and a clock generator 46. For communication with the CIP, the RSM further comprises a data transmission power line interface 52, a data transmission transmitter and receiver 54, and an inuut/output (I/O) interface circuit 56. For performance of its metering function, the RSM unit comprises a voltage and current interface 62, metering circuitry 64, and an I/O interface 66. A LED display 68 is also connected to the CPU through I/O interface 66.

The CPU illustratively is an Intel 8085 CMOS microprocessor, RAM 34 is a XD2210 non-volatile random access memory manufactured by Xicor Corp. of Milpitas, Calif., and ROM 36 is an MM2732 read only memory. I/O interfaces 56, 66 illustratively are an 81C55 and an 82C55 respectively.

Throughout the specification, integrated circuits and devices of the LM-, CD- and LF-type are generally available from National Semiconductor. Similarly, LS-type devices are generally available from Fairchild.

Figure 3:
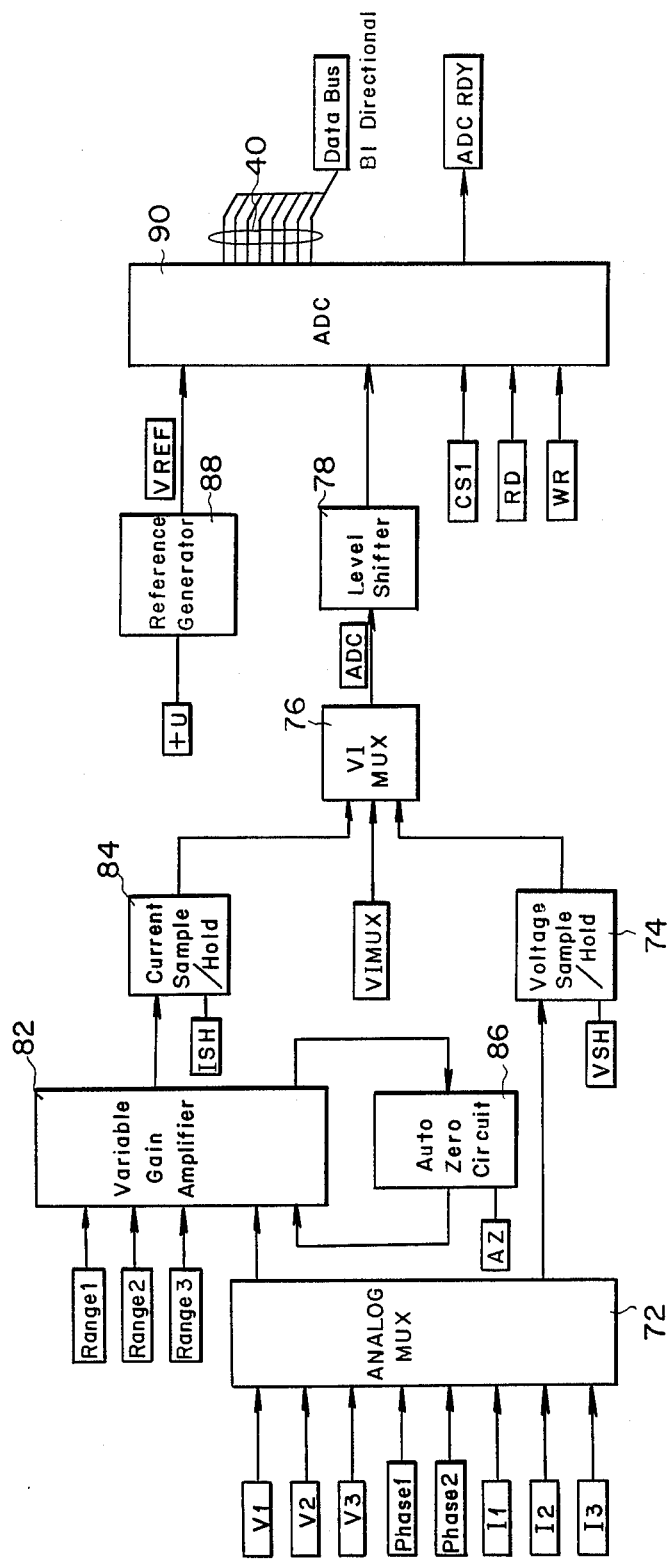
FIG. 3 is a block diagram of a meter circuit of the RSM of FIG. 2.

A more detailed block diagram of the metering circuitry is shown in FIG. 3. As indicated therein, inputs to the metering circuit include three inputs, V1, V2, V3 which are representative of the voltage on each of the three lines of a three phase power line, and three inputs I1, I2, I3 which are representative of the current on the corresponding three power lines. These inputs and ground are applied to an analog multiplexer 72 along with control signals phase 1, phase 2 from the CPU. The inputs representative of voltage are applied by the analog multiplexer to a voltage sample/hold circuit 74 where they are sampled and the sampled values are applied to a voltage/current multiplexer 76. The inputs representative of current are applied by the analog multiplexer to a variable gain amplifier 82, the output of which is applied to a current sample/hold circuit 84. Sampled values of the current are also applied to the voltage current multiplexer.

In general, it is preferred that sampling be carried out at a frequency which does not exceed twice the highest harmonic frequency present in the parameter being sampled which the meter is-capable of sensing. In sampling AC voltage and current, the sampling frequency preferably has the following characteristics: (1) the sampling frequency is not equal to the frequency of the alternating current, (2) the harmonics of the sampling frequency are not equal to any harmonic below the fifth harmonic of the frequency of the alternating current, and.(3) the sampling frequency is no more than three and one-half times the frequency of the alternating current.

The output of the voltage/current multiplexer is applied through a level shifter 78 to an analog to digital converter (ADC) 90; and the output of the ADC is made available to the CPU on a bidirectional data bus 40. The range of the variable gain amplifier can be selected by a coded signal from the CPU on three input lines range 1, range 2, range 3, and the amplifier can be zeroed under control of the microprocessor by application of the signal AZ to an auto-zero circuit 86. Operation of the voltage and current sample and hold circuits 74, 84 is controlled by the CPU by the signals VSH and ISH, respectively. Operation of the voltage/current multiplexer is controlled by the CPU by the signal VIMUX. A reference generator 88 supplies a voltage reference signal VREF to the ADC and the CPU controls the analog to digital conversion process by the signals CS1, RD and WR. The ADC indicates that it is ready to begin a conversion by providing the signal ADC RDY to the CPU. Further details concerning the metering section are set forth in FIGS. 10 and 11 below.

Figure 4:
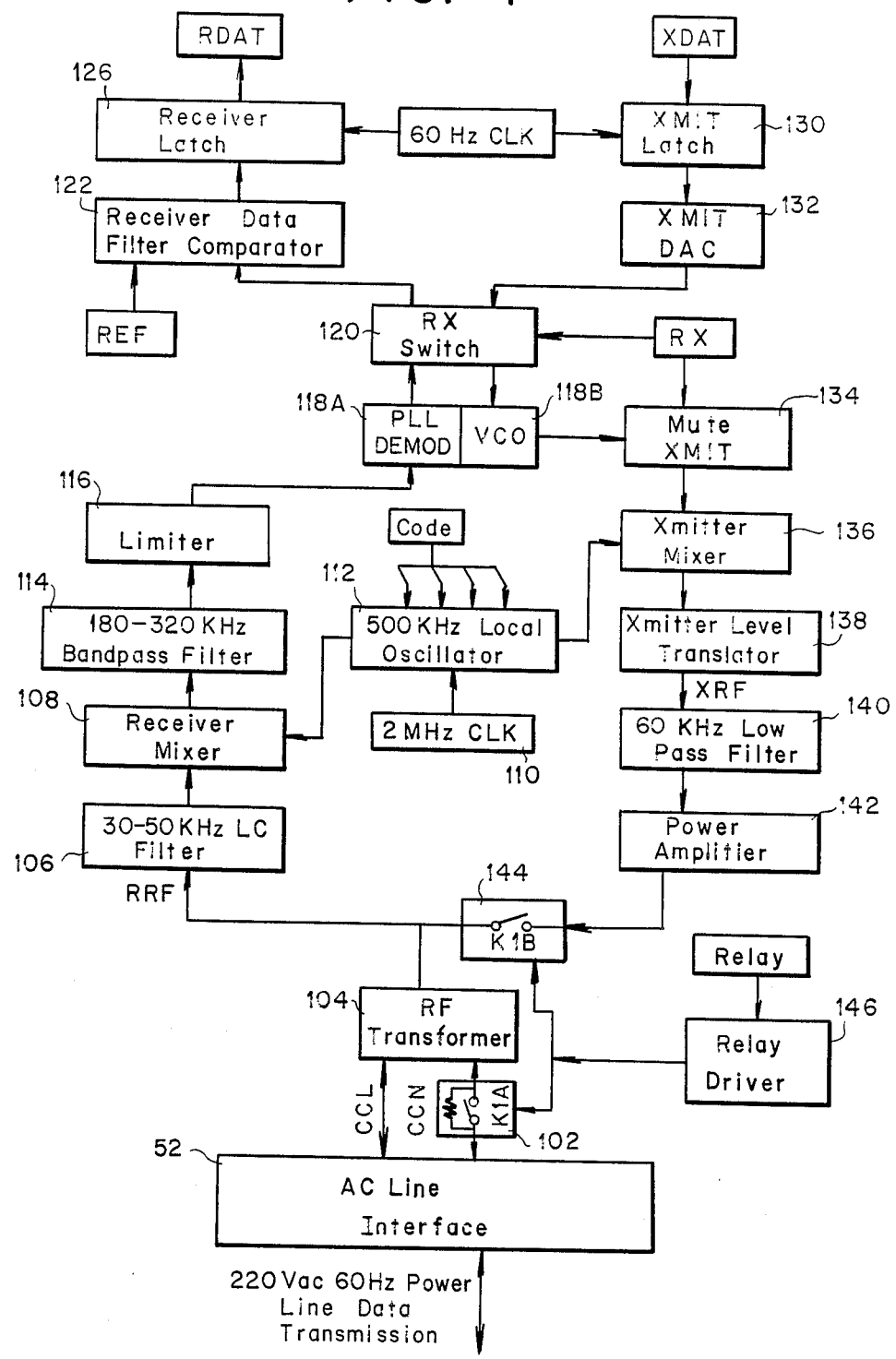
FIG. 4 is a block diagram of an illustrative embodiment of a data communication circuit of the RSM of FIG. 2.

A more detailed block diagram of the data receiver/-transmitter 54 is set forth in FIG. 4. As shown therein, a received signal from AC line interface 52 is applied through switch 102 and isolating transformer 104 to a 30-50 kHz filter 106. The output of the filter is applied to a receiver mixer 108 which mixes the received signal with the output of a switched frequency source comprising a 2 MHz clock 110 and a programmable divider 112. The output of the mixer is applied to a band pass filter 114, a limiter 116 and a phase locked loop demodulator 118A. The demodulated signal is then applied through a receive switch 120 to a filter comparator 122 and a receiver latch 126. The output of the latch is the received data RDAT which is made available through I/O interface 56 to the CPU (FIG. 2).

Data to be transmitted, XDAT, is provided to a transmit latch 130 and is converted to an analog signal by a transmitter digital to analog converter (DAC) 132. The analog signals from the DAC are applied through the receive switch 120 to a voltage controlled oscillator 118B which converts the analog signals to signals of differing frequencies depending on the data to be transmitted. Such a variable frequency signal is applied through a transmitter control 134 to a transmitter mixer 136 where it is mixed with radio frequency signal from the local oscillator. The output of the mixer is applied through a level translator 138 and a low pass filter 140 to a power amplifier 142. The amplifier output is applied through a switch 144 and isolating transformer 104 to the AC line interface 52 for transmission over the power line to the CIP. Further details concerning the RSM transmitter and receiver are set forth in FIGS. 12, 13 and 14 below.

Figure 5:
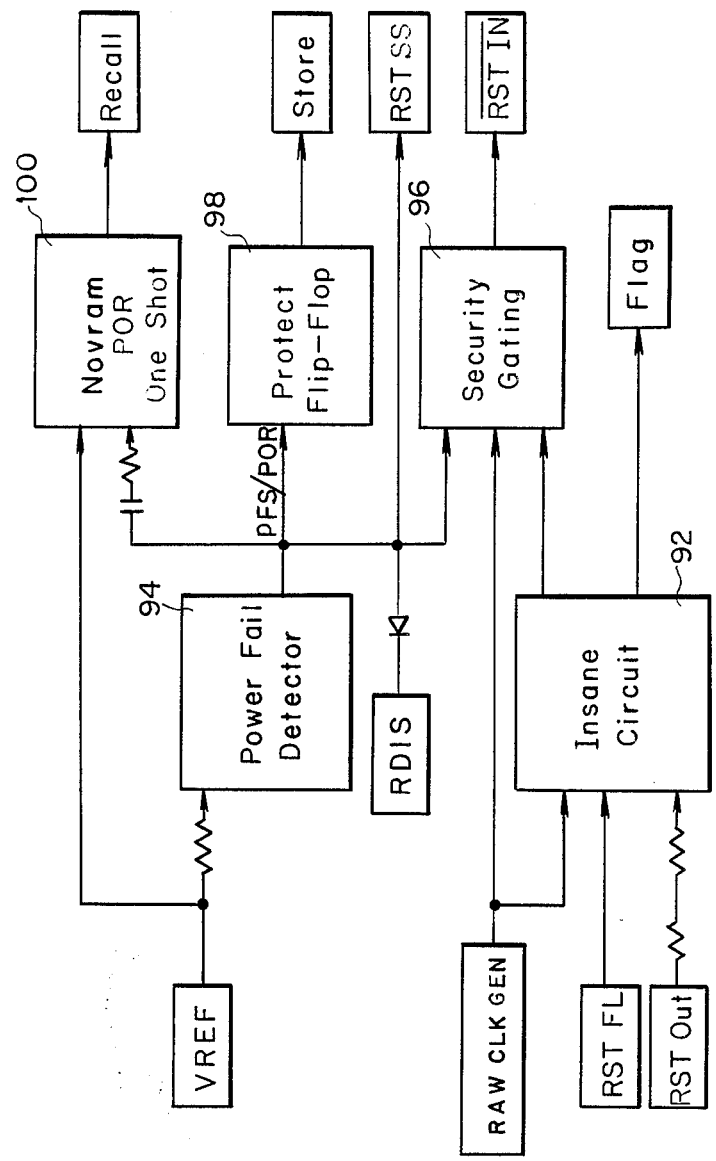
FIG. 5 is a block diagram of a memory protection section of the RSM of FIG. 2.

A more extensive block diagram of memory protection circuit 38 is set forth in FIG. 5. As shown therein, the circuit comprises an "insane" circuit 92 for protecting against CPU failure, and a power failure detector 94 for identifying incipient power failure. A security gating circuit 96 prevents inadvertent operation of reset circuitry and a protective flip-flop 98 determines when meter data is to be stored in non-volatile memory in the event of power failure. One-shot 100 provides for recall of data upon recovering from power failure.

A.C. Line Interface (FIGS. 2, 6 and 7)

Figure 6:
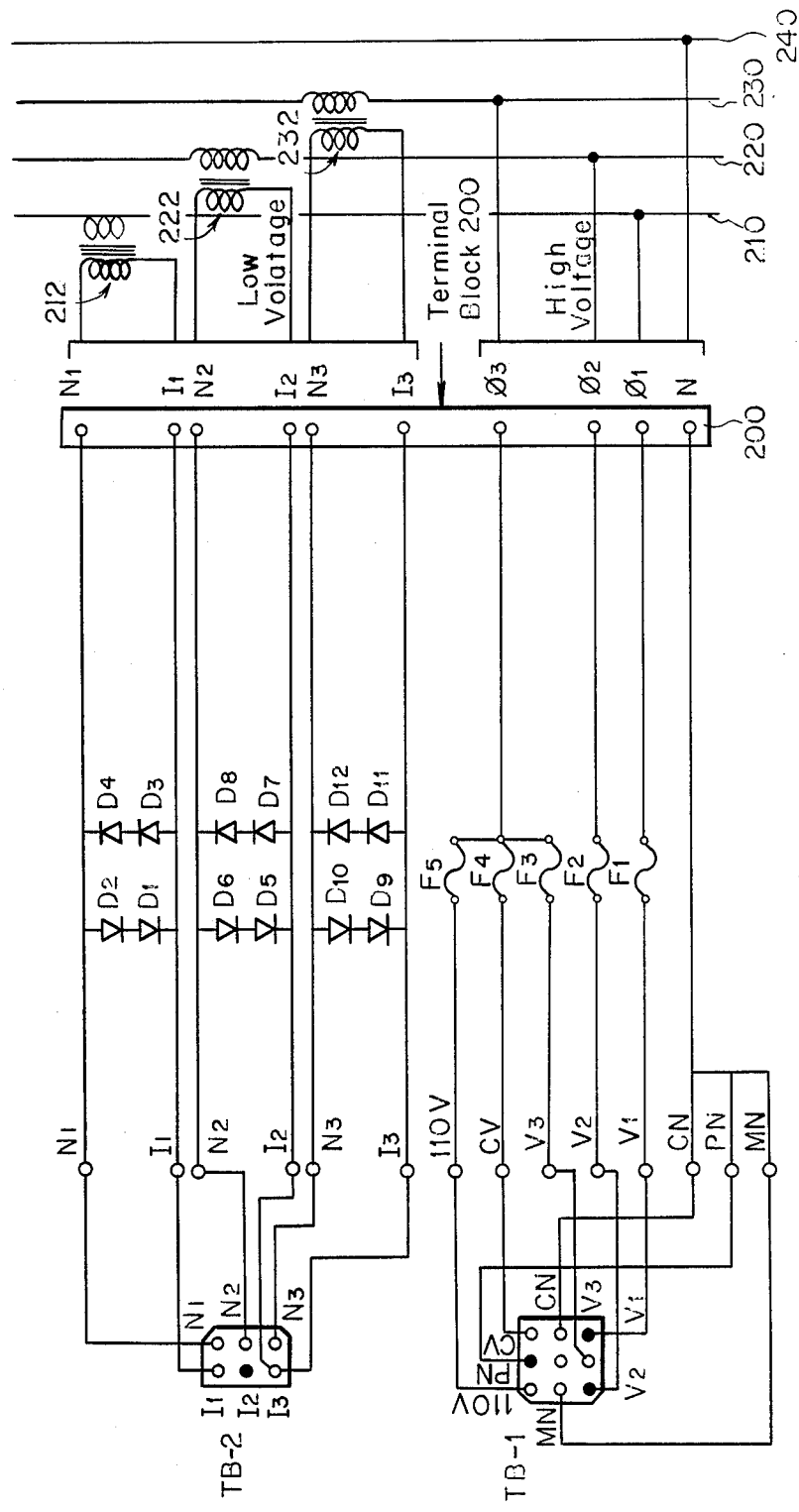
FIGS. 6 and 7 are schematic diagrams of portions of an AC line interface for the RSM unit.
Figure 7:
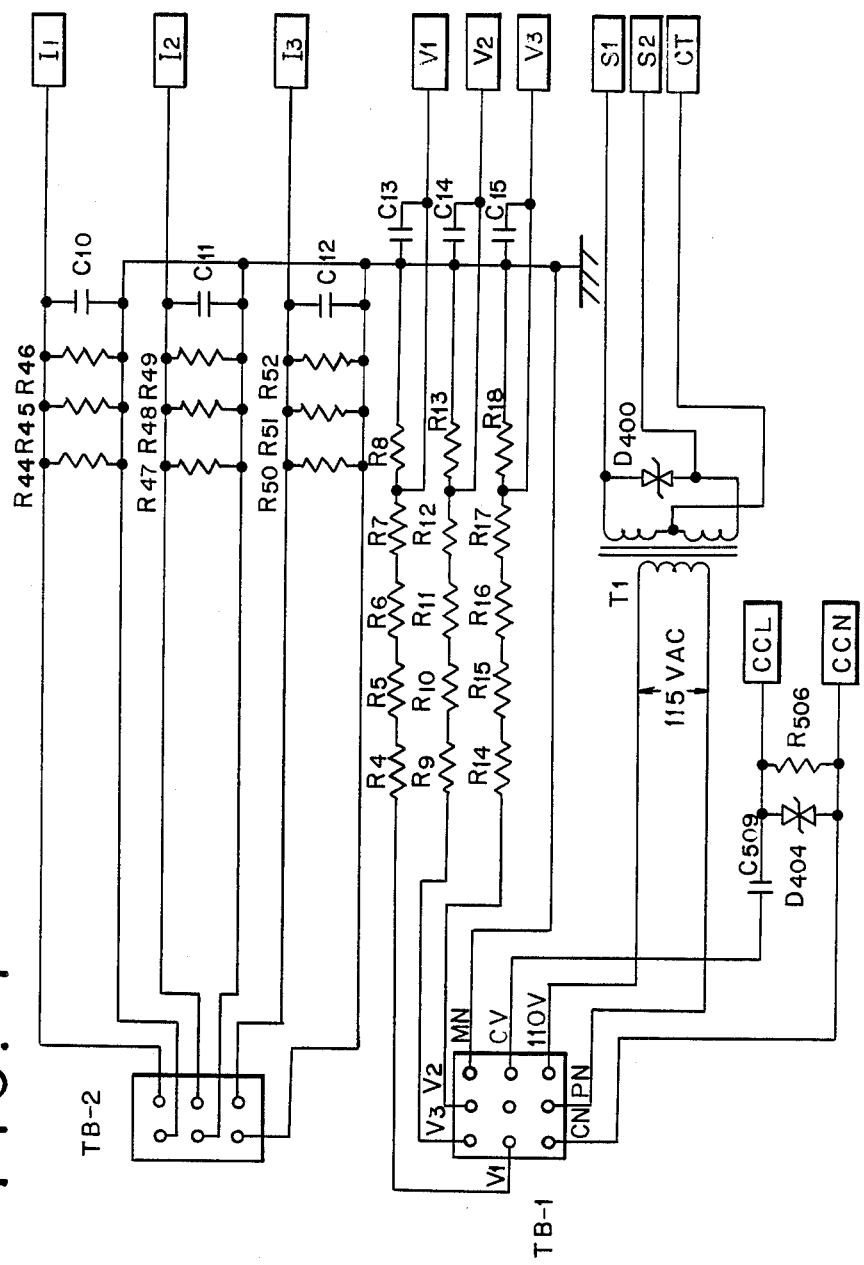

FIGS. 6 and 7 are schematic drawings of the AC line interface. As indicated in FIG. 6, a terminal block 200 is provided for connecting the RSM circuitry to the AC power lines 210, 220, 230 and the neutral line 240. As shown, each of the power lines is connected directly to one of the inputs phi 1, phi 2, phi 3 on terminal block 200 and the neutral line is connected to input N. These connections are used to generate signals representative of the voltage in each of the power lines, to derive a power supply and 60 Hz clock signal, and to provide for carrier current signalling. In addition, current information is derived from each of the power lines by a current transformer 212, 222, 232 coupled to each power line and connected to one of the pairs of inputs N1, I1; N2, I2; N3, I3; respectively, of terminal block 200. Protection against transients and high current levels is provided by the pairs of oppositely-poled diodes D1-D12. Protection against excessive current levels on the voltage lines is provided by fuses F1-F5. The voltage signals are connected through connector TB-1 of FIGS. 6 and 7 to the circuitry of FIG. 7. In similar fashion, the signals representative of current are connected through connector TB-2 of FIGS. 6 and 7 to the circuitry of FIG. 7.

As shown in FIG. 7, signals representative of the voltage on each of the power lines are applied to voltage dividing networks R4-R18 where they are divided down to produce signals V1, V2, V3 which are voltage signals having a range of approximately 1.3-2.0 Vrms proportional to the voltage in power lines 210, 220, 230. Signals for the power supply and clock generator are applied to a center tapped transformer T1, the output of which is made available on leads S1, S2, CT. Data signals are applied to an AC line interface comprising a 1uf capacitor C509, Transorb 7.5 volt transient suppressor D404, and resistor R506. The interface output is provided on leads CCL, CCN. The capacitor blocks the 60 Hz signal of the power line but allows the frequencies of interest (30-50 kHz) to pass. The resistor protects the transient suppressor in the event of inadvertent opening of the input lines.

The signals representative of current levels in power lines 210, 220, 230 are converted to proportional voltage levels by three resistive networks R44-R52 which shunt the current transformers. The outputs of these circuits are leads I1, I2, I3.

Figure 8:
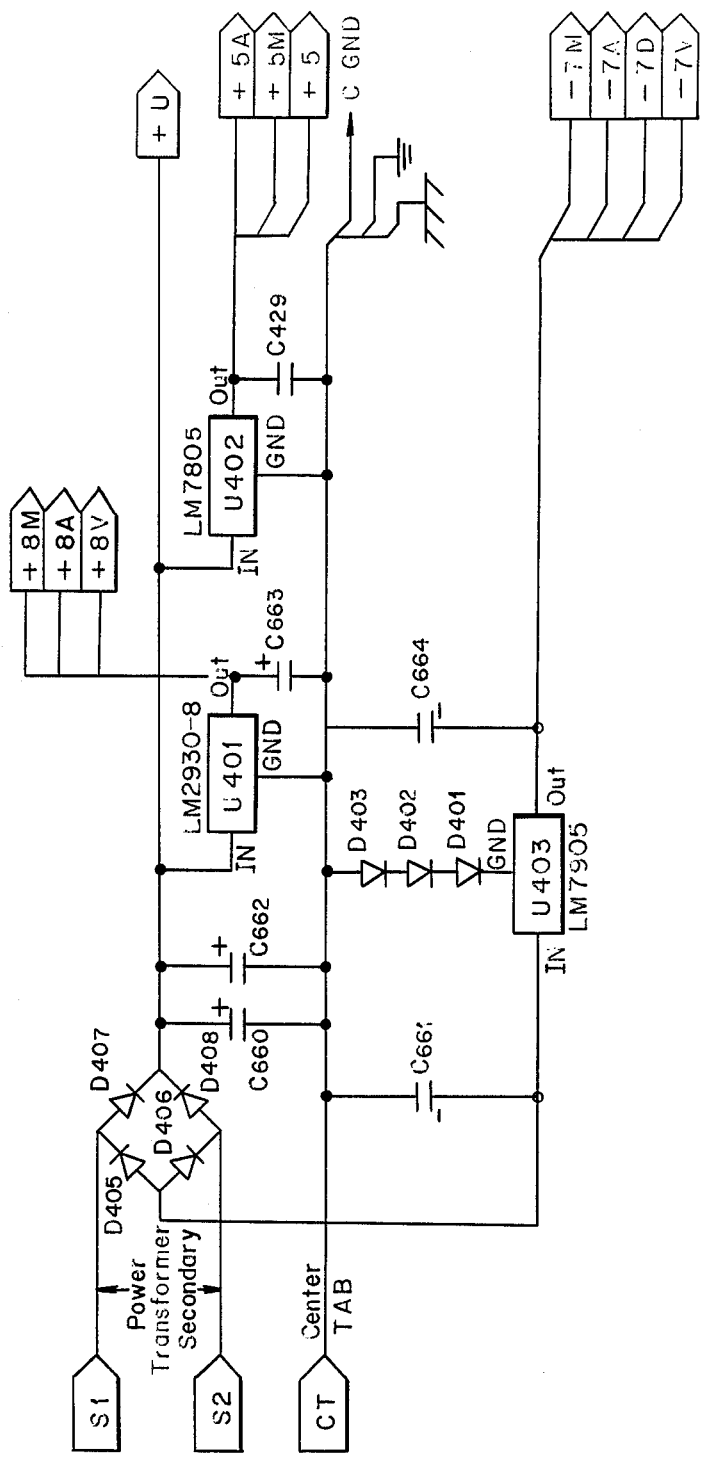
FIG. 8 is a schematic diagram of a power supply for the RSM unit.

Power Supply (FIG. 8)

The RSM power supply (FIG. 8) is a single, center-tapped, full-wave bridge rectifier D405-408 providing inputs to three linear voltage regulators U401-403. Regulators U401 and U402 provide positive outputs of 8 and 5 volts respectively. Both U401 and U402 tap their inputs from the same positive, unregulated line. To guard against regulator drop-out, an LM-2930-8 integrated circuit is used for the 8 volt line. This component is characterized by a maximum drop-out voltage of 0.6 VDC. The 5 Volt output is provided by an LM7805 Standard regulator.

Regulator U403 provides the supply's single negative voltage. Three IN4148 signal diodes D401-403 are placed in series with a ground terminal of an LM7905 regulator in order to boost the regulated output to −7 VDC. Output capacitors C429, C663, and C664 are added to improve transient response and noise rejection.

In addition to the standard filtering functions required on the regulator input side, a 10,000 uF capacitor, C660, is connected across the positive inputs to provide a system hold-up time of at least 10 ms in the event of power failure. This aspect of the RSM circuitry is included to ensure data integrity. Further information on data protection features is set forth in conjunction with FIG. 15 below.

Figure 9:
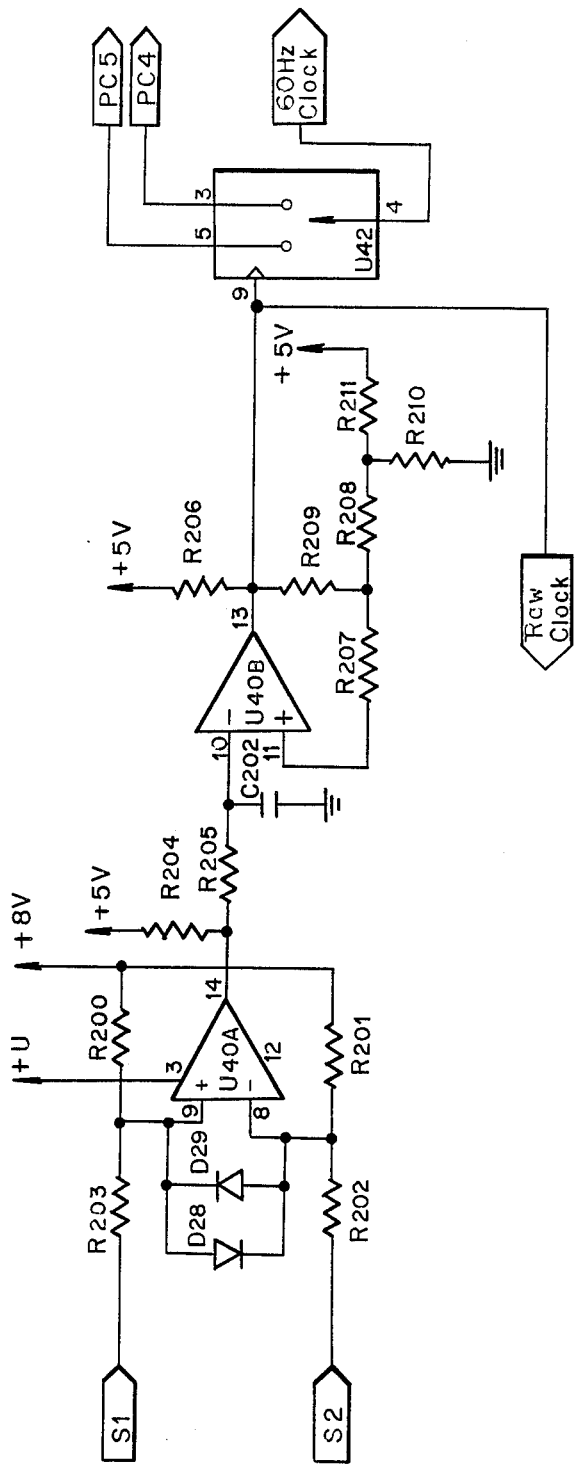
FIG. 9 is a schematic diagram of a clock generator of the RSM unit.

Raw Clock Generator (FIG. 9)

Several on-board components of the RSM unit require a 60 Hz clock for proper device operation. As shown in FIG. 9, this clock is derived by a clock generator from the 115 Vac 60 Hz signal present on the local power lines feeding the RSM power supply.

The inputs of the clock generator are taken from the secondary terminals of power transformer T1 (FIG. 7) in parallel with the inputs to the bridge rectifier described in FIG. 8. The signals present are approximately 30 volt peak-to-peak, 60 Hz sine waves, which are input to an LM339 differential comparator U40A through two identical voltage divider circuits. The four divider circuit components R200-R203 are 11K ohm, 1% tolerance precision resistors. An oppositely-poled dual-diode clamping circuit D28, D29 is connected across the comparator to insure that the differential inputs remain within a specified range.

Although the comparator output is a 60 Hz wave, signal jitter and impulse noise present make it unacceptable for clock applications. Accordingly, the signal is low-pass filtered through an RC circuit formed by R205 and C202. This filter integrates the square wave, producing a triangular wave output with some degree of phase shift. The filter output is presented to an LM339 comparator U40B, configured as a Schmitt trigger, which converts the triangular input to a 60 Hz square wave output without spurious edges. This output is the "raw" clock used in the timing of circuitry described in connection with FIGS. 14 and 15 below. The output of the clock generator, described hereinabove, is used to clock switch U42, which obtains its pins 5 and 3 inputs from the I/O part of 81C55 (U17) in FIG. 17B. One of these two inputs is a one and the other is a zero. As U42 is clocked its output switches between the two inputs, generating a 60 Hz clock output. If the two input levels are swapped by the microprocessor, the generated 60 Hz clock is inverted.

Advantageously, the clock generator uses precision resistors and capacitors to implement a clearly defined time-delay between the transformers' secondary input signals and the Schmitt trigger clock output.

Figure 10:
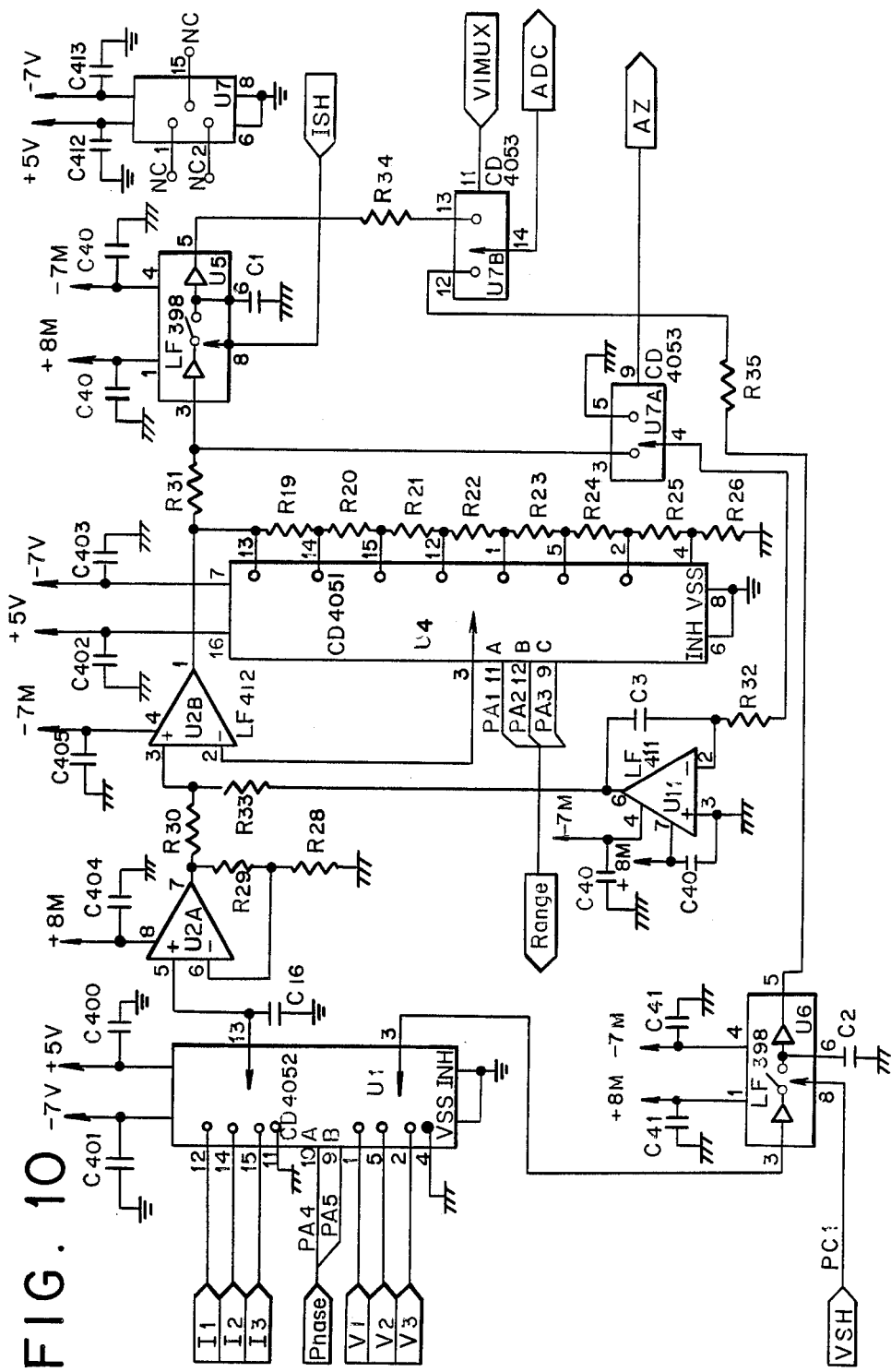
FIG. 10 is a schematic diagram of voltage and current sampling circuits of the RSM unit.
Figure 11:
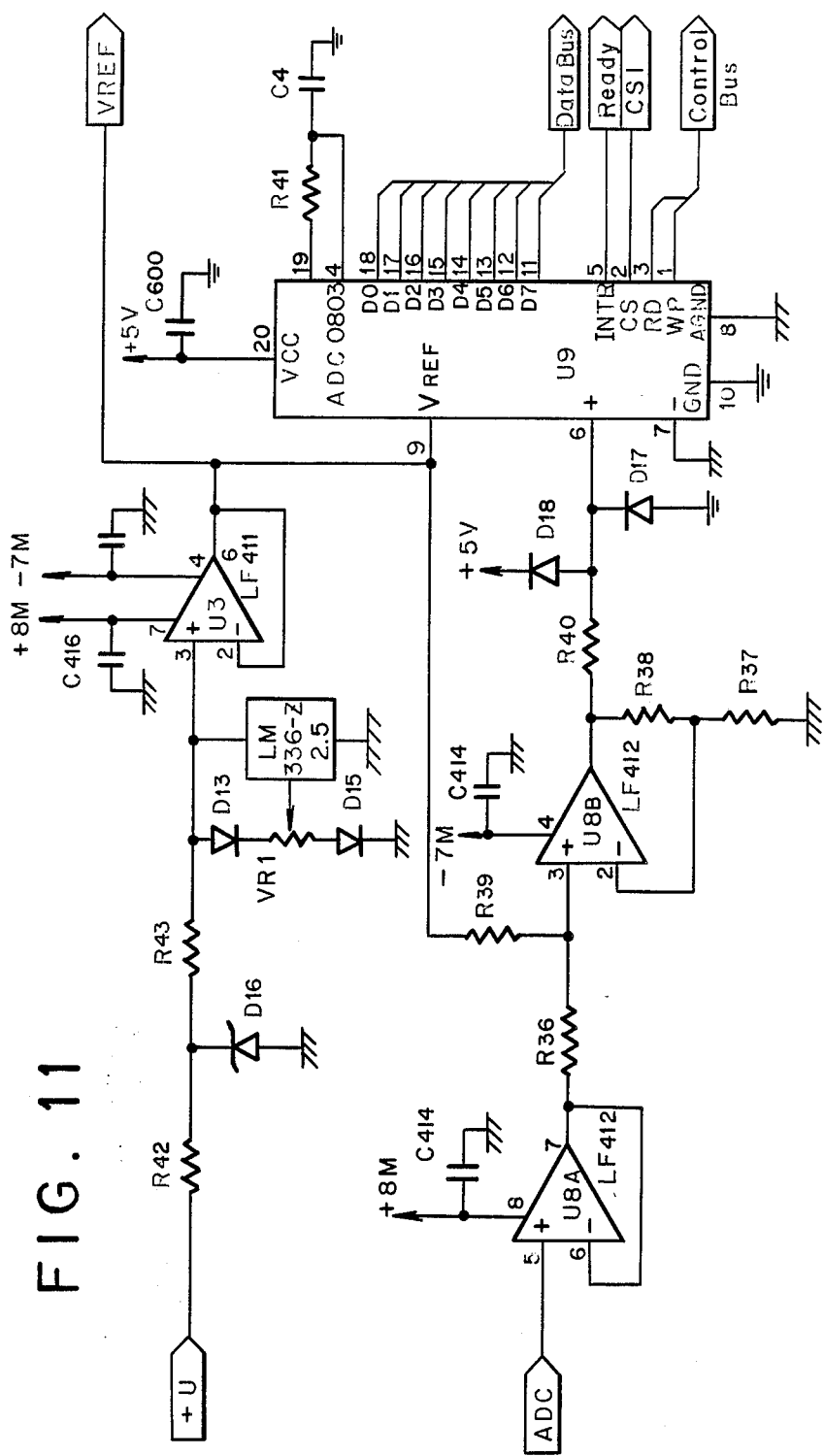
FIG. 11 is a schematic diagram of an analog-to-digital converter and reference voltage generator portions of the RSM unit.

Meter Section (FIGS. 3, 10 and 11)

The RSM meter section is a microcomputer-controlled system in which simultaneously-sampled voltage and current values of a given phase are presented sequentially to an analog-to-digital converter (ADC). The ADC, in turn, provides digital values to the RSM CPU, which performs the calculations necessary to derive meaningful energy-usage data.

As indicated in the discussion of FIG. 6, six inputs, three of current and three of voltage corresponding to the three phases of the local power system, are tapped from the power lines serving the individual energy user. The six metering inputs are referenced to the circuit ground which is tied in common with power line neutral. Advantageously, care should be taken to avoid ground loops and to protect from noise from the power lines.

The three-phase inputs are switched into the metering circuitry by a CD4052 analog multiplexer U1 (FIG. 10). Current and voltage inputs of a given phase are switched through simultaneously to be sampled and processed together by the RSM circuitry.

The voltage signal, which has a relatively narrow and clearly defined range between 1.3 and 2.0 Vrms, is routed directly to an LF 398 sample-and-hold circuit U6. The voltage samples are held on a 0.022 uF polypropylene capacitor C2 having the low dielectric loss necessary for accurate sampling.

The voltage sample is then switched through a voltage-current multiplexer V-I MUX 76 (FIG. 3) into an analog-to-digital converter ADC 0803 U9 manufactured by Intersil (FIG. 11).

The three current inputs which are expressed in terms of voltage have a wide dynamic range of approximately 200-to-1. For this reason, a two-stage variable-gain amplifier with computer-controlled auto-zero and auto-ranging support circuitry is inserted between the input multiplexer U1 and an LF398 current sample-and-hold circuit U5. The current samples are held on capacitor C1 which is identical to C2.

Two amplifier stages U2A, U2B are required because the gain-band width product available at either single stage is not sufficient to provide the desired gain along with the low distortion and phase-error necessary for proper meter operation.

Because the two amplifier - gain stage has large gain, offsets at its input would become large at its output. To minimize this potential problem an auto-zero integrator U11 is inserted around U2B. The auto-zero circuit has two positions, zero and hold. When U7A connects the output of U2B to R32, the integrator zeros the output of U2B, compensating for any offset at its input. When U7A connects R32 to ground U11 holds its output and allows any additional signal input to pass through. In order to assure that only offsets are present at the input of U2B, when the zero position is selected an additional position is provided on U1 p11 to ground the overall input of U2A. After zeroing the output of U2B with U4 selected for maximum gain and U1 selected to ground the input, all other positions of U4 will also have been zeroed. This design advantageously allows for one integrator capacitor to correct all possible gain positions of switch U4.

Resistors R31, R34 and R35 are inserted for circuit protection of switches U7A, U7B at input pins 3, 12 and 13. Sample-and-hold circuits U2 and U5 operate with an 8 volt positive supply and would otherwise be capable of supplying damaging inputs into the 5 volt supplied switches U7A, U7B.

The current and voltage sample outputs from V-I MUX vary within a range of +2.5 volts. The ADC require inputs within a 0-5 volt range. As shown in FIG. 11, the voltage level from the V-I MUX is buffered and level shifted by U8. Resistor R40 and diodes D18 and D17 protect the input of the ADC from overload.

The ADC, U8B and U40D (FIG. 15) require an input reference voltage which is supplied by the reference generator circuit. This circuit operates from the unregulated voltage tapped from the positive side of the bridge rectifier. Generation of the reference voltage requires a relatively constant current supply. In addition, the power-fail detection circuit discussed in conjunction with FIG. 15 below requires that the reference voltage remain constant while the power supply voltages rise and fall. For these reasons, resistor R42, 5.6V Zener diode D16 and resistor R43 supply current to the LM336Z-2.5 reference diode. The reference diode is configured in the temperature compensating mode and is adjusted for 2.40 volts for minimum temperature coefficient. The voltage is then buffered by an LF411 op-amp. The buffer is required to drive the circuits connected to the voltage reference line (VREF).

Upon receiving a write command from the processor, the ADC begins the conversion process. When digital information is ready for the CPU, the ADC informs the processor with an ADC ready signal and the information is read out over the system data bus. As indicated above, each output value from the ADC is then corrected for circuit offsets by use of the correction factors stored in the memory of the microprocessor.

Communications Section (FIGS. 4, 12, 13 and 14)

The communications section is that portion of the RSM unit dedicated to data communications between the RSM processor and its CIP supervisor. Information between the two modules is transmitted over six, 100 Hz bandwidth, 60 baud, FSK channels, spaced apart in the band between 30 and 50 kHz. The system is half-duplex send/receive, i.e. either the CIP or the RSM is transmitting at any given time. The same data is replicated on all six channels and transmitted simultaneously from the CIP to the RSM. The RSM receives on a single channel and transmits back to the CIP on the particular channel it received on.

The location of the bit centers in the 60 baud data stream is defined by the 60 Hz clock generator; and synchronization between the transmitter/receiver of the CIP and that of the RSM is maintained by deriving the clock signal for both the CIP and RSM transmitter/receivers from the same 60 Hz power line. Despite group delays in the receiver filters and phase delays in the raw clock generators, there is a clearly defined time delay between the CIP and the RSM which is compensated for by the computer program in the CIP.

Component-by-component discussion of the communications section is presented first from the standpoint of data reception from the CIP, through the receiver circuitry to the RSM processor, followed by discussion of the transmit mode.

Data enters the RSM through the CCL and CCN terminals shown in FIG. 7. An AC line interface comprises a 1uf capacitor C509, a Transorb 7.5 Volt transient suppressor D404, and a resistor R506. The capacitor blocks the 60 Hz signal of the power line but allows the frequencies of interest (30–50 KHz) to pass. The resistor protects the transient suppressor in the event of a circuit failure which opens circuitry subsequent to the transorb.

Figure 12:
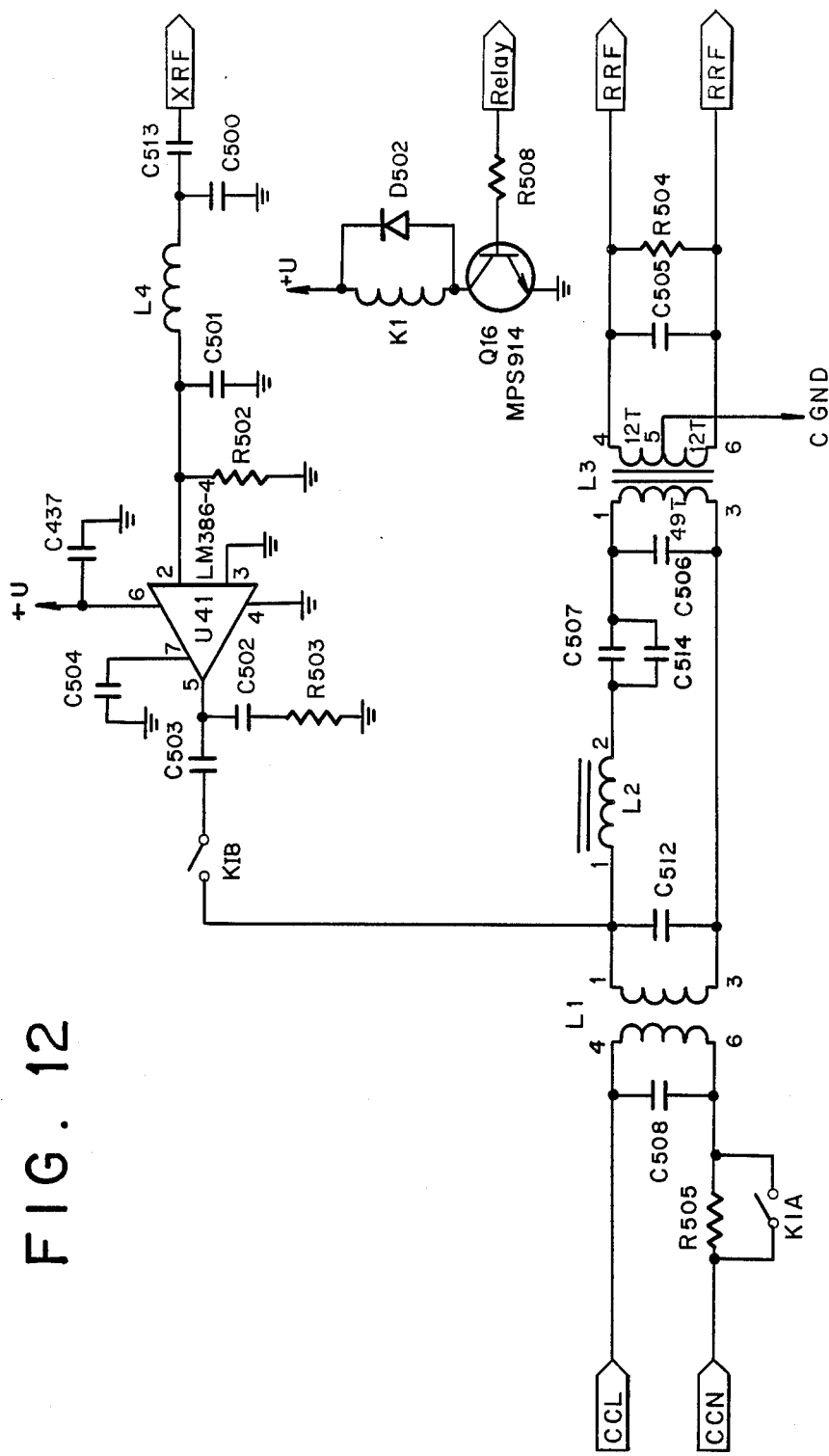
FIGS. 12, 13 and 14 are schematic diagrams of portions of the communications section of the RSM unit.
Figure 13:
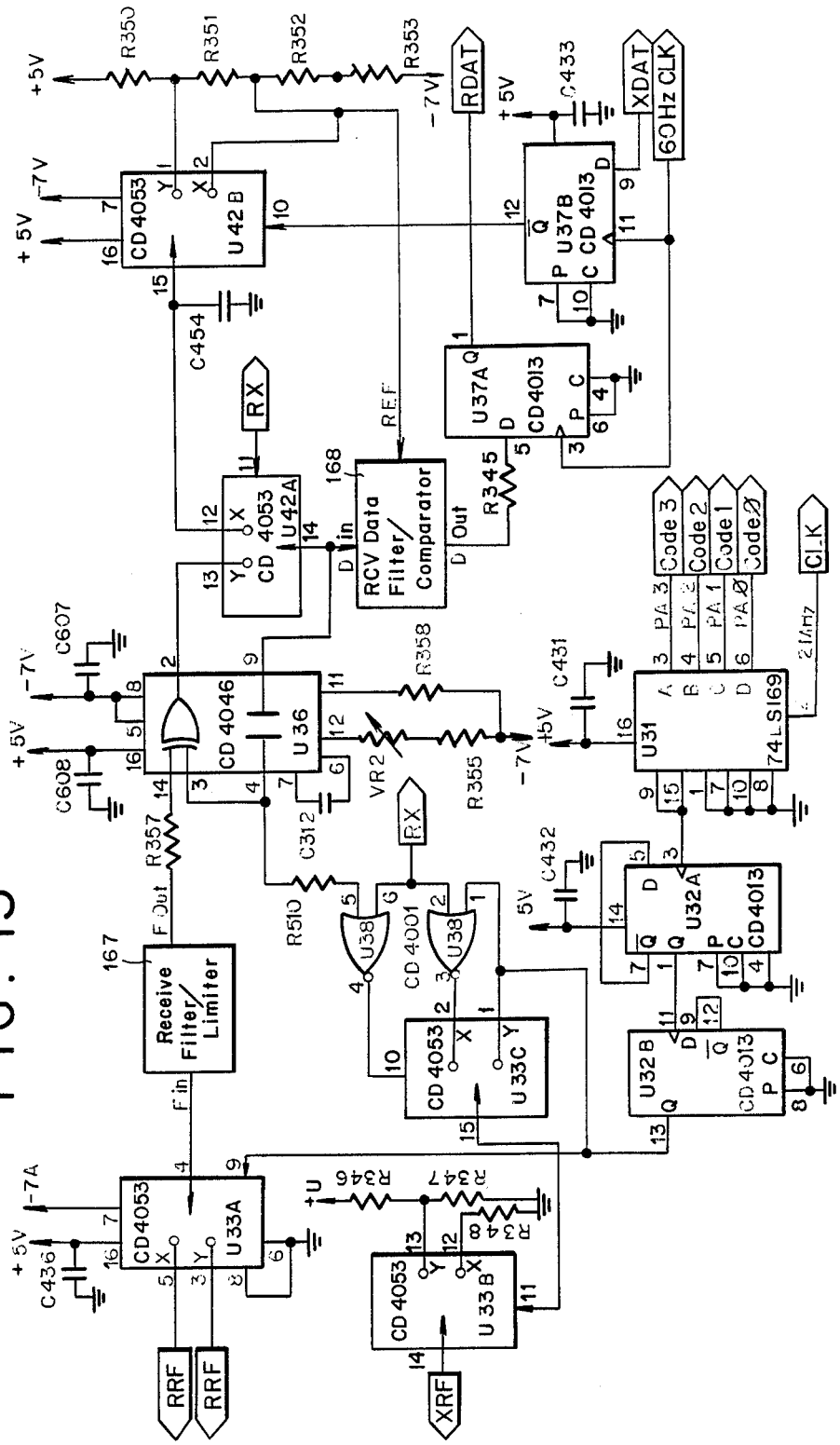
Figure 14:
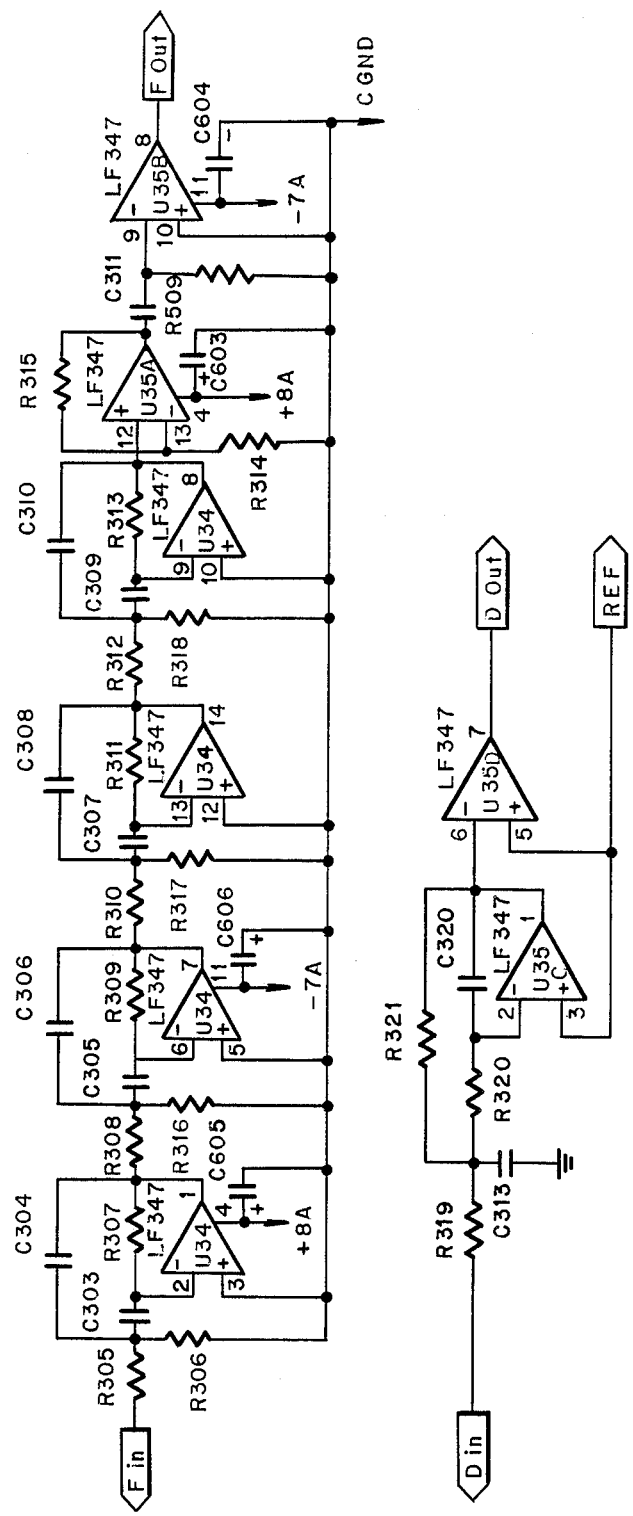

The received signal is processed by the circuitry of FIGS. 12–14 configured as a classic superheterodyne PLL receiver.

In the receive mode, a central processor-driven relay switch K1A is open. This places a 39 ohm resistor R505 in the signal path. This resistance, added to the average impedance of the line, provides a 50 ohm input impedance required by the initial filter stage of the receiver.

As discussed above in conjunction with the meter section, circuit ground is referenced to the neutral of the local power lines. Because the carrier current line may not have the same neutral as the power lines connected to the meter inputs, the incoming data signals are transformer-isolated via transformer L1. The signals are then presented to a 3-pole, LC, bandpass filter is input to transformer L3 having configured in a pi-type section. The filter has an output impedance of 50 ohms, and a center-tapped output providing differential signals for the following stage.

The filter output RRF is applied to a receiver mixer of FIG. 13. The mixer is a CD4053 analog switch which takes the differential output of the preceding filter, selects either side of it, and multiplies by ±1 to provide the intermediate frequency. The mixer obtains its local oscillator input from a central processor-controlled, counter/frequency-divider block (FIG. 13).

The counter comprises a 74LS169 programmable 4-bit counter U31 that divides the 2 MHz clock output of the CPU by integral values ranging from 11 to 16. Each of these values is then further divided by a factor of four by two serially-connected CD4013 D-flip-flops U32A, U32B. This yields six values of frequency in the range between 30 and 50 kHz corresponding to the six FSK communications channels.

The signal input to the mixer is six channels each of which contains an RF signal carrier and shifting values of 225 and 275 Hz which are FSK signals representing the mark and space (Binary 0 and 1) elements of the data being communicated. The data being communicated in each channel is the same. The RSM microprocessor uses a parity check to determine if the data recieved on a first channel is good. As long as the data is good the microprocessor continues to monitor the data received on that channel and uses the same channel to transmit data to the CIP. If, however, the received data fails the parity check, the microprocessor tests the other data channels, in turn, until it finds a good channel and then uses that channel for data communication. The microprocessor switches from one channel to another by modifying the number it presents to the counter U31 that is used to divide the 2 MHz clock signal.

This approach of multi-channel communication, with six widely separated channels available where only one is necessary for communication, and a very narrow bandwidth for communication on each channel, allows for a high degree of protection against deliberate and non-deliberate signal interference.

The mixer output is connected to a 250 Hz filter/limiter 167 in a double side-band receiver configuration. (Because the CIP transmits single side band, one side band is received as a noise channel.) The filter (FIG. 14) is a four-pole Butterworth active filter using an LF347 operational amplifier U34 with four multiple feedback, single-pole bandpass filters. The filter has a gain of approximately 10. The limiter provides further amplification and clips the signal. The limiter output is fed through a 1000K ohm protection resistor R357 to the input of U36, CD4046 single-pole filter-demodulator. The voltage controlled oscillator (VCO) frequency is 200 Hz for input at the negative rail and 300 Hz for the positive. This places the mark and space frequencies of 225 and 275 Hz at ¼ and ¾ of the rail to rail values respectively. The VCO control line of the PLL passes through central processor controlled receive/transmit switch U42A and enters a two-pole data filter/comparator 168, depicted in more detail in FIG. 14 and comprising U35C, D.

The filter section, with a rolloff at 70 Hz, eliminates the 250 Hz IF signal and its harmonics. The comparator squares up the signal and yields the 60 Baud data. The now fully demodulated signal enters a receiver latch U37A (pins 1–6), which is clocked by the 60 Hz line-derived clock discussed in conjunction with FIG. 9. When freed from its immediate tasks, the central processor reads in the data from the latch.

Data to be transmitted is provided by the CPU to a transmitter latch U37B (pins 7–12), along with the 60 Hz clock from FIG. 9. The latch output is presented to a transmitter digital-to-analog converter (DAC) U42B. The DAC is a two-position analog switch, with an external voltage divider circuit which selects either ¼ or ¾ of the ±5 to −7 rail-to-rail voltage swing. These voltages are presented to the VCO of the CD4046 PLL demodulator U36 through U42A. The VCO is adjusted during manufacture to produce either of the two frequencies, 225 Hz Mark, 275 Hz Space, depending on the position of the DAC switch. The VCO output signal is connected through a 100K ohm protection resistor R510 to a pin 5 input to U38 of a CD4001 mute transmit circuitry. In the PLC receive mode, the RX control signal disables data transmission to the CIP. In the transmit mode, the 4001 NOR gate passes the transmitter output from the VCO and local oscillator frequencies from the counter into inputs to a CD4053 transmitter mixer U33C.

The local oscillator frequencies are the same six values available to the receiver. The particular frequency selected by the microprocessor is mixed with the mark and space values to produce a frequency shift keyed (FSK) signal in which the frequency of the signal depends on whether a mark or a space is present at pin 10 of the transmitter mixer.

The mixed digital signal is then presented as the select input of a transmitter level translator U33B. The switch inputs of the translator are configured such that the XRF output is proportional to the positive unregulated voltage tapped from the RSM power supply. This is to provide the maximum possible amplitude for the data output and avoid clipping during low-voltage operation. The translator presents a 470 ohm output impedance to the following stage which is a 60 KHz low pass filter (FIG. 12). An input capacitor C513 blocks the DC offset from the previous stage. The filter eliminates any objectionable harmonics generated in the mixing process and presents its output to a linear power amplifier U41. The amplifier provides the voltage and current gain required to transmit directly onto the AC line.

It is necessary that the amplifier output be switched in by relay switch K1B. Without provision of the relay, the output impedance of the amplifier will load down the line and attenuate the received signal to unacceptable levels. It should be noted that the transmit signal is turned off before switching of the relay; and the relay is closed prior to enabling transmit. This allows switching under no-load conditions and increases relay life by a factor of about 100.

Figure 15:
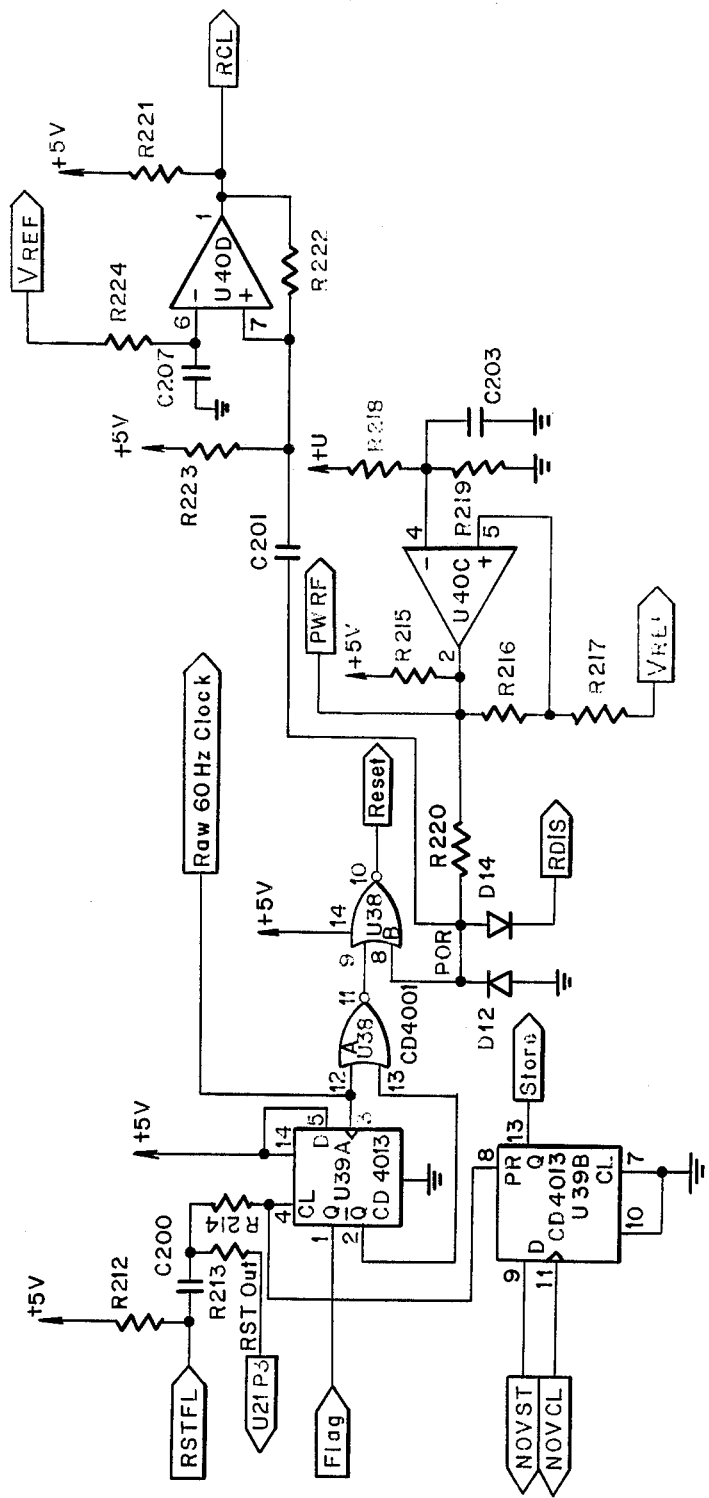
FIG. 15 is a schematic diagram of an illustrative embodiment of a data protection circuit of the RSM unit.

Protection Section (FIGS. 5 and 15)

Data integrity takes on special significance in the RSM system. Because the data gathered and processed by the RSM computer is directly related to revenue, loss of data is, in many cases, equatable with loss of revenue. For this reason, there are a number of design features built into the RSM for the purpose of decreasing the likelihood of data loss. Transient malfunction, for whatever reason, can cause the RSM CPU to "jump its program" and require a manual reset to restart it. For the period of downtime involved, data will be lost and irrecoverable to the unit. For this reason, the RSM hardware, in effect, monitors CPU stability and resets the processor if malfunction is detected. This portion of the RSM circuitry is called the "insane circuit". The initial input to the insane circuit is the 60 Hz clock discussed above in conjunction with FIG. 9. The 60 Hz clock is routed from the output of the raw clock generator to a CLK2 input at pin 3 of D-type flip-flop U39A. U39A is a CD4013 dual D flip-flop with its pin 5 input tied permanently to +5 volts. On the rising edge of the 60 Hz clock, the Q output of flip-flop U39A goes high and $\overline{Q}$ goes low. The Q high "flag" output alerts the processor, through its 8IC55 port, that a reset of the CPU will take place in 8.33 ms (½ the cycle of the 60 Hz clock), unless the processor disables this process by pulsing the pin 4 input of the flip-flop through the 8IC55 "RST FL" signal. The internal loop of the CPU is completed within approximately 4.8 ms and, therefore, if the processor is functioning properly, it has sufficient time to respond to the flag test. If the CPU is not responding properly, the $\overline{Q}$ output from flip-flop U39A will remain low for more than 8.33 ms at which time the 60 Hz clock will also go low, causing both inputs at pins 12 and 13 of a NOR-gate U38A to be low. These inputs, in turn, provide a high input to pin 9 of U38B which is sufficient to send its pin 10 output low and reset the CPU.

The AC coupling to pin 4 prevents clearing of the flip-flop due to DC levels. Were this precaution not taken, the CPU could conceivably "jump its program" and at the same time assert RSTFL, defeating the purpose of the insane circuit. It is much less likely that the processor could "jump its program" and still continue to pulse RSTFL. The CPU RST out signal clears the insane flip-flop upon reinitialization.

Figure 16B:
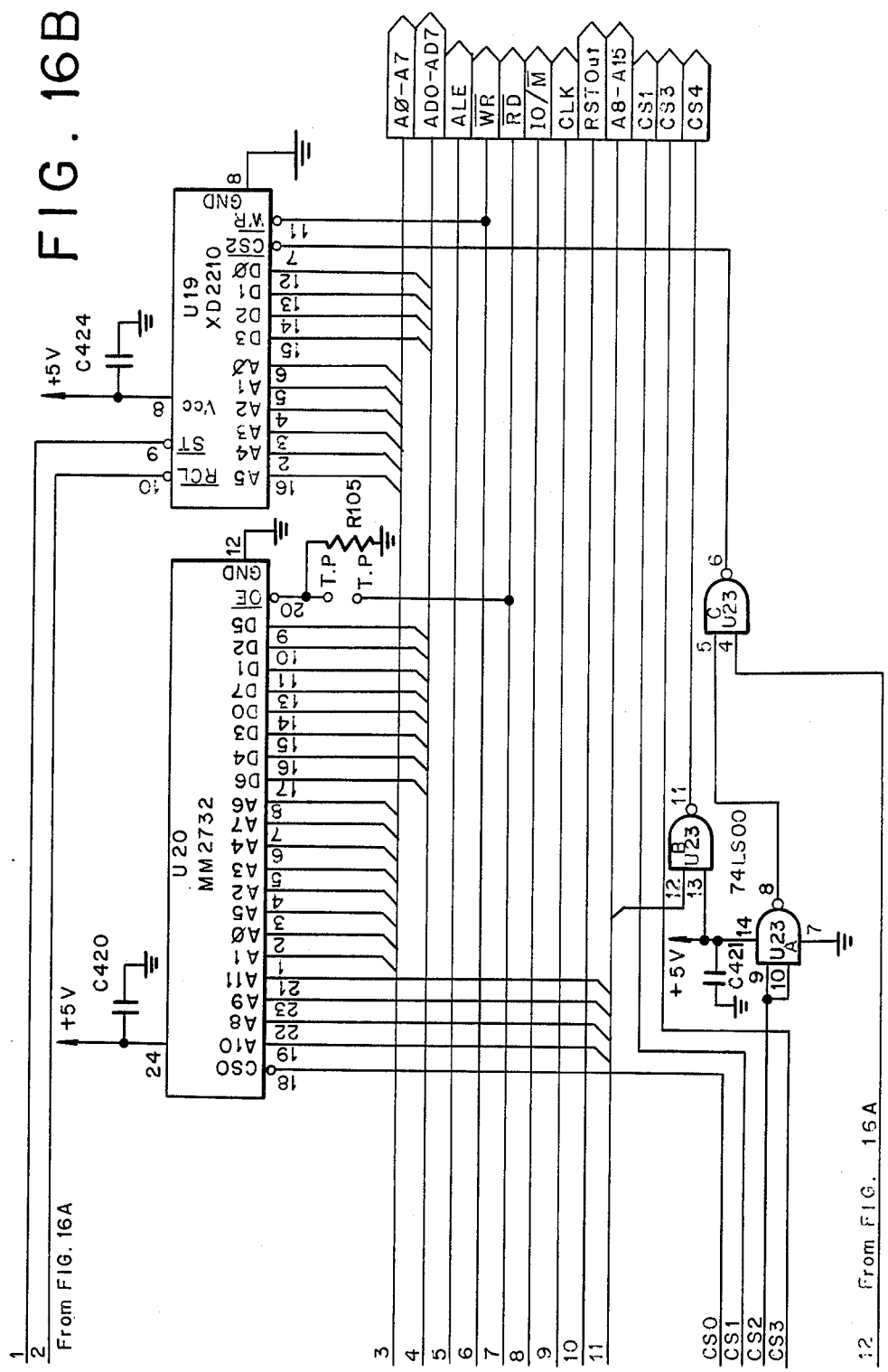

A second feature of RSM data protection is provided by a "protect" flip-flop U39B, which directly affects the data integrity of a non-volatile memory U19 (FIG. 16B). The XD 2210 non-volatile memory U19 comprises a conventional static RAM overlaid bit-for-bit with a non-volatile E2 PROM. At any time, data can be transferred between these two sections of memory by the use of the Store and Recall signals. An inadvertent Store is protected against by making such an operation dependent on two separate 8IC55-generated control signals, NOVST and NOVCL. NOVST provides a low input to the D input of protect flip-flop U39B, and NOVCL provides the clock whose rising edge triggers the NOVRAM store function. The store is generated by providing a digital low on the store line output from the Q terminal of flip-flop U39B. By routing the RST FL line to the set input at pin 8 of U39B, store functions are prevented during CPU reinitialization. Further protection is provided for U19 by NOVRAM access control gating (FIG. 16) comprising three 74LS00 NAND gates U23A,B,C. The legitimacy of NOVRAM chip select is insured by gating the read, write and chip select signals generated by the CPU and a NOVTOG signal from the 8IC55 of FIG. 17B.

As its name implies, the Power-Fail detector circuit (FIG. 15) recognizes when the RSM unit is losing power and alerts the CPU to implement the NOVRAM store function. This is accomplished by comparator U40C configured as a Schmitt trigger. As the inverting input at pin 4 of amplifier U40 falls below the reference value applied to pin 5, the pin 2 output snaps high. This interrupts the CPU through the PWRF line. During the time the NOVRAM store operation is being performed, the reset disable signal RDIS is low, clamping pin 8 of NOR gate U38B to an approximately ground level potential and preventing CPU reset. When the store operation is completed, RDIS goes high and the processor is held in reset until power on.

Because the CPU cannot distinguish between a restart caused by an insane circuit reset and a power on reset, the NOVRAM recall function must be implemented by hardware. An insane circuit reset does not produce a RAM store operation beforehand; in other words, after insane reset the CPU will continue its operations where it left off without data loss. During a power-fail cycle, however, a necessary store operation has been performed and recall is necessary upon repowering the system. Recall is accomplished by comparator U40D configured as a one-shot. When pin 2 output of amplifier U40C goes high, the one-shot is initialized; and when the unregulated supply voltage rises past the reference voltage on power-up, the one-shot is triggered, thereby pulsing the recall signal from the pin 1 output of amplifier U40D.

Figure 17B:
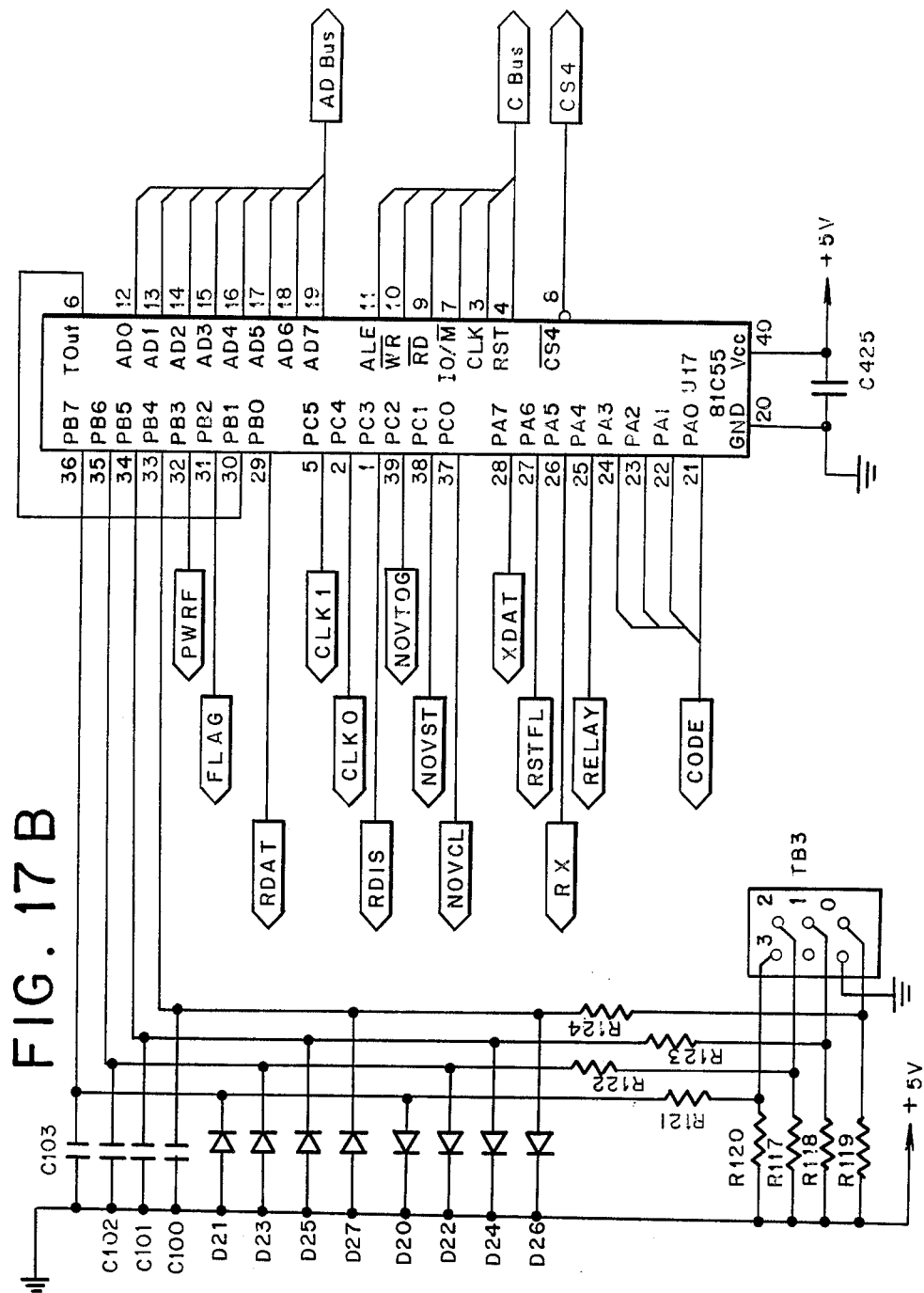

Except for the tamper switch input, external inputs are filtered and protected by resistors R117 to R124, diodes D20 to D27 and capacitors C100 to C103 (FIG. 17B).

Display Section (FIG. 18)

The RSM display section (FIG. 18) comprises an 8-digit, 7-segment China Semiconductor CS-247C display U25, U26, a CD4511 7-segment latch, and driver U14, a 74LS138 decoder U13 and eight transistor buffers Q7–Q14. Multiplexing operations for the display are performed by software. Segment selection is input to the 4511 from the 82C55 output port of FIG. 17A. A 4-bit binary coded decimal number is converted by U14 to a 7-segment positive-logic output code. For example, to display the number 6, the C, D, E, F and G outputs of latch U14 are high. There are no tails on the six and nine digits, and the one digit is right-justified. There are 100 Ohm current-limiting resistors between the output of U14 and the display inputs.

Digit selection is input to decoder U13 from the 82C55 with a 3-bit select code. The 74LS138 outputs are buffered by eight 1802, common collector pnp transistors Q7–Q14. This provides a single-digit current-sinking ability of 98 ma (14 ma per segment×7). The decimal point is driven directly from the 82C55, with the drive signal buffered by a 1402 NPN follower transistor Q15.

RSM Firmware

The purpose of the meter firmware is to control the meter hardware and to accumulate energy consumption which can be read by either the built in display or by power line carrier communication. Broadly, the program is divided into two parts, the energy meter and the power line carrier communications. Appendix I is a source listing of this program.

Energy Meter

The energy meter firmware performs two basic functions—sequencing the hardware and calculating the energy.

Referring to FIG. 10, the sequencing of the meter is as follows. This sequence of operations is performed for each voltage and current "phase-pair" that is switched through into the metering circuitry. Referring back to FIG. 10, first the non-inverting input of amplifier U2A is zeroed by central processor-controlled switching of multiplexer U1 to its grounded pin 11 input. U2B is then set to maximum gain when the microprocessor switches U4 to the lowest resistor of an eight-resistor voltage divider circuit R19–R26 that provides U4 with its inputs. The maximum gain setting provides maximum offset voltage and the resulting output is switched through pin 3 of switch U7A into an auto-zero circuit, built around integrator U11. The output of U11 is summed into input pin 3 of U2B through a divider composed of R33 and R30. While U7 is switched to its pin 3 input the integrator loop drives the output of U2B toward the input offset voltage of the integrator. When U7 is switched to its pin 5 (grounded) input at the end of the zeroing the integrator holds its output voltage. In this way, the auto-zero integrator compensates for the U2 amplifier offset over several zeroing cycles.

With the zeroing functions complete, the processor selects the phase and the appropriate gain for the current input. This setting is based on the history of current input for the given phase and is retained and updated in RAM.

After allowing for amplifier settling time, the current signal is held in capacitor C1 of sample-and-hold circuit U5 and then routed sequentially with the voltage sample through the V-I MUX into the ADC circuit.

The next phase of inputs is then selected, and the preceding sequence of operations is repeated.

The calculation of the energy is as follows. The sequencing of the metering circuit produces a pair of 8 bit readings per phase. These numbers correspond to the physical quantities of current and voltage. The relation of the number produced by the ADC to the physical units depend upon the signal path from source to ADC. For the voltage there are three paths corresponding to the three different phases. For current there are 24 paths corresponding to 8 ranges for each of 3 phases. The ADC produces a number from 0 to 255. The relationship between the magnitude of the number measured by the ADC and physical units is the scale factor. The scale factor is different for each of the signal paths. The number corresponding to zero volts or amps is the offset.

The scale factors for current depends on the current transformer, C.T., the range of the adjustable gain amp U2, the tolerance of the gain determining resistors used in the meter circuit and the ADC. The scale factor for voltage depends only on resistor values and on the gain of the ADC. Because the final measured quantity is energy, the scale factor of each sampled energy unit is the product of the scale factors of the voltage and current and the sampling time interval.

The samples of voltage and current are multiplied, corrected for offset, and accumulated in a 16 bit multiplicaton - accumulation register. There are 24 multiplication registers, one for each range and phase. An overflow from any of these accumulation registers represents a quantity of energy.

This amount of energy is different for each phase and range.

A 24 entry table of 6 digit BCD numbers called the calibration constants records the energy in kilowatt hours corresponding to an overflow from the corresponding 24 multiplication accumulation registers. These constants are programmed into the ROM of the RSM at the time of manufacture by comparison of the RSM under test to a standard Watt-hour meter on each phase and range for a period of time. These constants represent the actual scale factor of the RSM on that phase and range corrected for any errors in the resistors, current transformers, ADC reference, or sampling time interval. By calibrating the meter in this way, relatively imprecise components can be used and yet produce a precise instrument. In practice the calibration constants for any phase or range vary by up to 10%, yet the calibrated meter is better than 1% accurate. This ten-fold increase in accuracy would be expensive to achieve by the conventional means of using more accurate components.

Every time there is an overflow from any of the 24 multiplication accumulation registers, the program adds the appropriate 6 digit calibration constant to the total energy register. The total energy register is a 14 digit kilowatt hour register. The top 8 digits of the energy accumulator register are stored in the NOVRAM and can assume the values from 00000.000 to 99999.999 kilowatt hours.

The offset correction is done at the time of each multiplication, yet the offset used is not the nominal value of 128 but a value calculated by the meter program. This method achieves very good meter "balance" or insusceptibility to accumulating energy in the absence of applied power. For the purpose of the offset calculation the samples are divided into groups of 32768. For the first group of 32768 samples the nominal offset is used. During this time, the average current and voltage are calculated. Because the average current and voltage measured over 32768 samples should be zero (128 on the ADC), this average is equal to the offset. During each subsequent group of 32768 samples the program uses the calculated offset of the previous 32768 samples.

The preferred program calculates the sampled power as $$P = VI - O_V O_I$$

Where
$O_V$ is the offset of the voltage and
$O_I$ is the offset of the current, instead of $$P = (V - O_V)(I - O_I).$$

The preferred formula yields the energy corrected for offset when the power increments calculated in this manner are summed up. Effectively, in the preferred formula the VI term is total power and the $O_VO_I$ is offset power.

The current transformers have time delays which are large enough to cause inaccuracy if not corrected. The meter corrects for the time delay of a nominal C.T. by sampling the current slightly ahead of the voltage. C.T.s have different time delays depending on the magnitude of the primary flowing current. To account for this, the meter delays a different amount depending upon the range.

When selecting the range for a particular phase the meter uses the history of the current. The microprocessor software implements "fast-attack, slow decay" AGC circuit. The meter changes to a lower gain setting immediately upon recognizing an out of range current. However, the meter does not select a higher gain unless too little current has been flowing for 43 consecutive samples. The meter stays on a particular range as long as the peak current value is within particular limits. During a time when a constant load current is flowing some individual samples would necessarily be close to zero in magnitude because the input waveform is AC. The meter uses the "fast-attack, slow-decay" AGC method because ranging for individual samples would upset the time delay compensation mentioned above.

This concludes the important features of the meter energy calculation firmware.

Communications Firmware

The communications firmware controls the power line carrier hardware, sends and receives data to and from the CIP, and counts and/or latches, external pulses and/or contact closures.

The alarm and tamper inputs, described hereinabove, are read and stored in NOVRAM. Any alarm condition is latched and stored in the status word, also in NOVRAM.

"Gasmeter" input negative edges are counted in BCD and stored in NOVRAM.

Receive Functions

The serial data output of the carrier current receiver, derived as described hereinabove, is tested for an 8 bit edgeword. Once an edgeword is identified, the processor tests for a valid command. If an edgeword and valid command are not identified in 256 bits (the longest command is 36 bits including edgeword), the microprocessor switches channels by changing the divide code of U31 in FIG. 13 as described hereinabove. Thus, channels with data destroying interference are skipped. When there are no CIP transmissions, i.e., there is no valid data on the line, the RSM will channel scan continuously.

When the RSM changes channels, or is restarted from an "insane" or power up Reset, or there is a power failure as described hereinabove, the program increments one of three 4-bit counters in the NOVRAM status word, to record the fact that one of those three events occurred.

There are eight valid numerical commands that may be sent from the CIP to the RSM (0–7). If the command is "0", "2"or "3"the RSM will unconditionally perform the functions required by the command. If the zero command is received, the 12 bit address sent by the CIP is stored in RAM. When either a "1", "4", "5", "6"or "7"command is received, the above address is compared with the RSM's own address which is permanently stored in EPROM and unique in a given system. If the comparison fails, the command is ignored and the microprocessor restarts the 256 bit count, as above, without changing channels. If the addresses match, the RSM will perform the functions required by the command.

If a command requires a reply, the RSM will turn on the transmitter as described hereinabove and disable the display for the duration of the transmission, thereby reducing peak drain from the power supply.

The "4" command has a 4 bit argument which can specify a variety of actions. The "4.1" command causes the RSM to select the current kilowatt hour reading for future transmission. The "4.2" command similarly causes the RSM to select the external (Gasmeter) count and the "4.7" command similarly causes the RSM to select the NOVRAM area containing the status word, display flag, data clock buffer, and the calibrate/meter-/install flag buffer. When restarted from reset, the microprocessor examines the latter flag buffer and chooses to run the calibrate program (used only for factory calibration) or the meter program. If the install flag is set and a "3" command is received, the RSM will send its address. If the install flag is not set, the "3" command is ignored. The install flag can be set at the factory. To set it in the field, all the external inputs accessable on TB3 must be shorted to ground while a "4.5" command is received. The "4.3" command resets the install flag regardless of the state of the above inputs. The "4.4" command resets the status word. The "4.0" command disables the display button and the "4.C" enables it. When it is enabled, pushing the display button results in a 10-second display of the kilowatt hour data. The display button must be released and pushed after timeout to obtain another ten seconds of display. The "4.E" command sets the data clock to normal phase and the "4.F" command inverts it. This feature allows the CIP to maximize the number of RSMs on a single polling data clock as is set forth hereinbelow.

The "2" command causes all RSMs to format for transmission the data selected by the "4" command as hereinabove described and stores it in an output buffer. The "6" command causes the currently addressed RSM to transmit the contents of the abovementioned output buffer.

The "1" command causes all RSMs to increment by one the address received and stored in the "0" command described hereinabove. The RSM with an address match responds as in command "6", above.

The "5" command causes the currently addressed RSM to transmit the contents of the status word which is described hereinabove.

The "7" command works as described in the "5" command except that both the RSM's own address and the status word are sent.

This concludes the important features of the communications firmware.

COMMUNICATION INTERFACE PROCESSOR (CIP)

Refering to FIG. 19 there is shown a block diagram of the Communications Interface Processor of the remote metering system. The basic elements of the CIP are a standard telephone modem 1010, a Central Processing Unit CIP-CPU 1020, a Power Line Carrier PLC unit 1040 and a Phase Coupling Module PCM 1060. The standard telephone modem 1010 is used for communiaations between the CIP and the central billing computer and may be for example a Signalman Mark VII standard 300 baud modem from Anchor Automation Inc. Van Nuys, Calif. The CIP - CPU 1020 is the stored program microprocessor based master control unit of the CIP which under program - control transmits and receives information to and from the RSMs through the PLC unit 1040; transmits and receives information to and from the central billing computer through the telephone modem 1010; stores information; and stores the date and time of day. The Power Line Carrier 1040 employs a unique interference resistant transmitting and receiving system for communications over the a.c. power lines between the CIP - CPU and the RSMIS. The Phase Coupling Module 1060 of the illustrative embodiment is inductive/capacitive coupled to the a.c. power line and is capable of coupling the data transmission from and to the RSM over any phase of the a.c. power line. A detailed description of the PCM is given in the AC line interface section of the RSM description hereinabove. The CIP of the illustrative embodiment is capable of reading, storing data from, and monitoring 4096 RSM units.

Referring to FIG. 20 there is shown a block diagram of the CIP - CPU. Microprocessor 1021 is clocked by clock 1027 and executes program instructions stored in ROM 1025. In the illustrative embodiment the microprocessor is a standard 8 bit unit such as the Model 8085 manufactured by Intel Corporation Santa Clara, Calif. Microprocessor 1021 has a data bus 1026 over which data is exchanged among Time of Day unit 1022, RAM 1028, Parallel I/O port 1024 and Serial I/O port 1023. Program instructions from ROM 1025 are also passed to microprocessor 1021 on data bus 1026. A listing of the program instructions for controlling the CIP-CPU of the illustrative embodiment is given in Appendix II. This program controls the microprocessor in such a manner that the functions of CIP are performed. The program has two major functional divisions, a communications function and a monitor/housekeeping function. These functions are identified in as the XMIT Routine Version 2.0 and CIPMON Version 2.6 respectively.

The XMIT Program is called by CIPMON and directs the microprocessor control of communications with the RSMs on the CIP network. In the illustrative embodiment the central billing computer directs the execution of CIPMON by commuication with the microprocessor through the telephone modem 1010 and the serial I/O port 1023. The specific communication is determined by one of seven numbered commands and a '0' command which are selected and delivered over data bus 1026 to parallel I/O port 1024 and transmitted to the RSMs by PLC 1040.

The '0' command sends a 12 bit current address selected at the central computer site to all of the RSMs. As is more fully explained hereinabove, each RSM is assigned and permanently stores its own unique 12 bit address code. When the RSM receives the 12 bit address transmitted by the '0' command that address is stored. When either a '1', '4', '5', '6' or '7' command is received that address is compared with the RSMs unique address. If they are the same, the RSM transmits the indicated response over the noise free channel selected in accordance with the description hereinabove.

The '1' command causes all of the RSMs to increment by '1' the address received and stored upon receipt of the '0' command. The RSM with the 12 bit address corresponding to this incremented address then responds with its address and the kilowatt hour reading stored in its output buffer.

The '2' command causes all of the RSMs to store in their output buffer the current value of the measured quantity as selected by the "4" command, described hereinabove, which had been previously stored in its memory in the manner described hereinabove.

The '3' command is used during initial installation of RSMs for tests which ensure that the system has been properly installed.

The '4' command is a set status command. This command has a four bit argument that causes the RSM to either select kilowatt hour meter data; or select setable switch or pulse input data; or reset the install flag; conditionally set install flag; or reset the status register; or disable the display; or enable the display; or read flags from a register; or set data clock phase.

The '5' command is a read status command. This command causes the currently addressed RSM to respond with the contents of its status register. This register contains the status of the currently addressed RSM which was either set by a '4' command or set in accordance with the description herein above.

The '6' command causes the currently addressed RSM to transmit the contents of its output buffer.

The '7' command causes the currently addressed RSM to transmit its status and address.

The foregoing is a brief description of command and data communication functions performed by the microprocessor 1021 under direction of the XMIT Routine.

The CIPMON routine is the monitor or executive program of the CIP. This routine directs microprocessor 1021 to execute all of the tasks performed by the CIP that are not performed by the XMIT program. For example, CIPMON controls all access to RAM 1028; obtains the date and time from Time of Day device 1022; and supervises communications through I/O ports 1023, 1024.

Referring to FIG. 21 there is shown a block diagram of CIP - PLC unit 1040. The CIP - PLC is a single channel, single sideband version of the RSM - PLC shown in FIG. 4 and described hereinabove. In this version, one channel of data to be transmitted to the RSMs is sent by CIP - CPU 1020 to the CIP - PLC through parallel I/O port 1024. This data stream is input to six identical Frequency Shift Keying transmitters 1051 - 1056. The output of these transmitters is summed in summer 1048 and the summed signal is transmitted over the a.c. power lines through PCM 1060. A transmit enable relay 1058 is provided so that data is transmitted only when CIP - CPU 1020 applies the appropriate signal to the XMIT/REC control line 1050. The transmitters 1051–1056 of the illustrative embodiment are designated channels 1–6 and transmit mark ('1') and space ('0') at the frequencies shown in TABLE I. Because all data transmissions are encoded in a manner recognized by the RSM, it will be seen that the transmission of the identical data over all six channels enables the RSM to identify a particular channel that is not subject to interference as is described in more detail hereinabove.

Raw clock generator 1059 provides a 60 hz data clock for synchonization of transmitted and received data. This generator is essentially the same as that described hereinabove and shown in FIG. 9.

The inputs of Frequency Shift Keying Receivers 1041-1046 are connected to a 30-50 khz Bandpass filter which in turn is connected to PCM 1060. The outputs of these receivers are connected to the parallel I/O port 1024 of the CIP-CPU 1020. Thus, no matter which channel is chosen by the RSM the received data is transferred to the CIP - CPU 1020.

TABLE I

| CHANNEL | MARK FREQ | SPACE FREQ |
|---|---|---|
| 1 | 31475 | 31525 |
| 2 | 33558 | 33608 |
| 3 | 35939 | 35989 |
| 4 | 38687 | 38737 |
| 5 | 41892 | 41942 |
| 6 | 45680 | 45730 |

FIGS. 22-35 are detailed schematic diagrams of the circuits of the Communication Interface Processor of the illustrative embodiment.

Referring to FIG. 22, there is depicted the Master CPU and clock of the CIP. Clock generator U79 supplies an 8 MHz clock to CPU U1, illustratively an NSC 800 type device manufactured by National Semiconductor.

The decoding circuitry of the CIP (FIG. 23) provides decoding for the CIP. Address lines A13, A14 and A15 are each inverted by inverters U18 and input to NAND gate U19 to provide memory control signal $\overline{ROMCS}$. Memory read, ROM read and I/O read signals are produced by three NAND gates U17. Memory write signal $\overline{MWRT}$ is produced by OR gate U25 and inverter U18 and I/0 write signal $\overline{IOWR}$ is produced by OR gate U25.

Referring to FIG. 24, the buffer address lines to LOC of the CIP are depicted. Buffering is accomplished through U80 and U81, each of which comprises eight buffers. The output lines of buffers U80, U81 are input to RAM/IO.

The parallel I/O circuitry of the CIP (FIGS. 25A, 25B) comprises three I/O chips U62, U63 and U73, each an 8255 type device. Control signals $\overline{RD}$ and $\overline{WR}$ of U62, U63 and U73 provide for reading from memory and writing to memory while the data is applied to eight-bit line D0-D7 of U62, U63 and U73.

FIG. 26 depicts the insane and power fail circuits of the CIP. Operation of the insane and power fail circuits of the CIP are depicted in FIG. 26 corresponds to operation of the insane and power fail circuits of the RSM depicted in FIGS. 5 and 15 and the accompanying descriptions. The insane circuit protects against CPU failure while the power fail circuit identifies incipient power failure.

Additional buffer circuitry of the CIp is shown in FIGS. 27, 28. These buffers are used for the data passed through the parallel I/O circuitry of FIGS. 25A, 25B. Buffers U27, U26, U5 and U4 are Fairchild 74LS244 line driver/buffer type devices.

Referring to FIG. 29, there is depicted a schematic diagram of the clock back up circuit of the CIP.

Figure 30B:
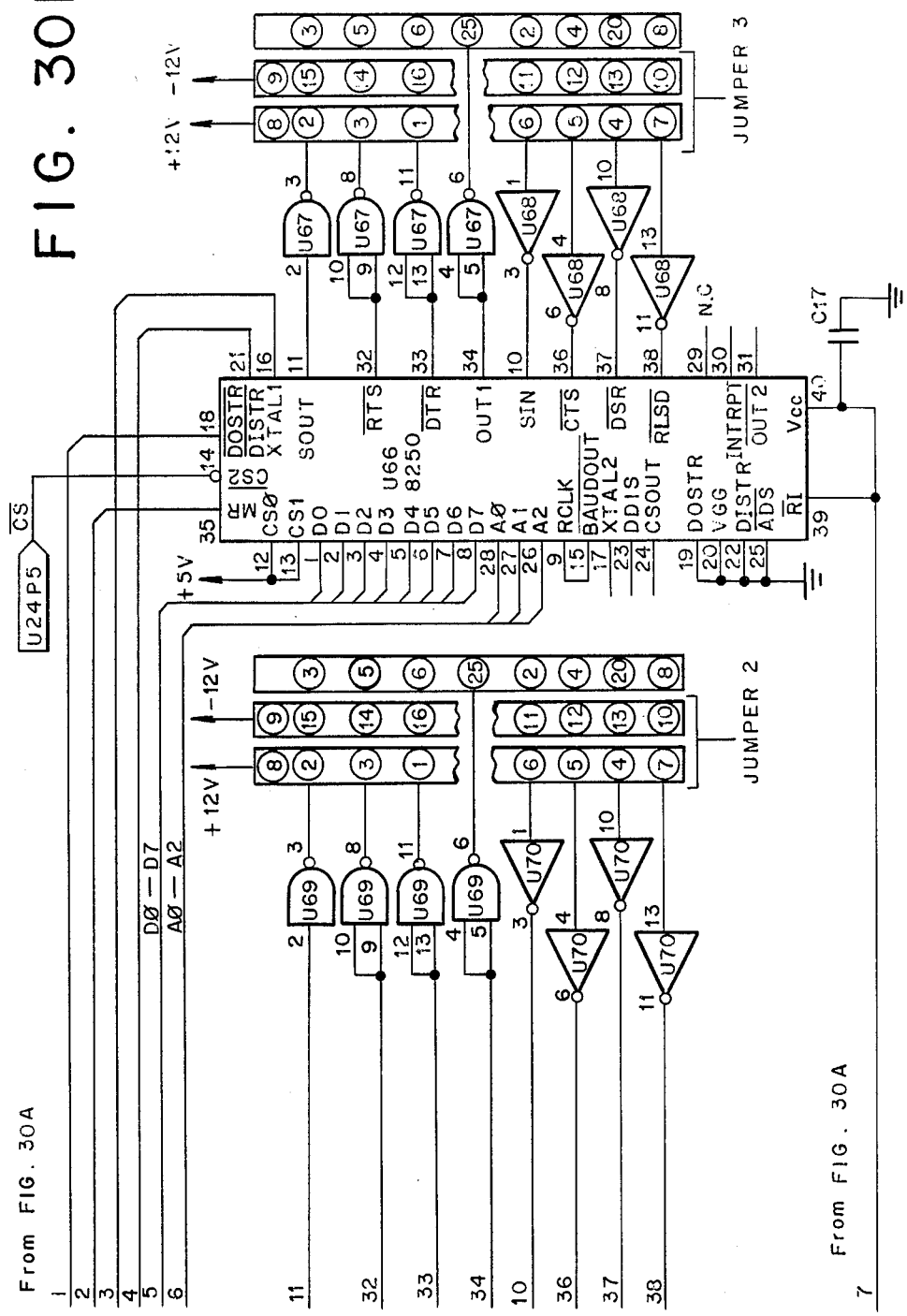

FIGS. 30A, 30B is a schematic diagram of the serial interface ports and RS232 buffers of the CIP. I/O devices U64, U65, and U66 are each 8250 type devices manufactured by National Semiconductor and are connected to address and data lines of memory to provide for input and output of data.

Figure 31B:
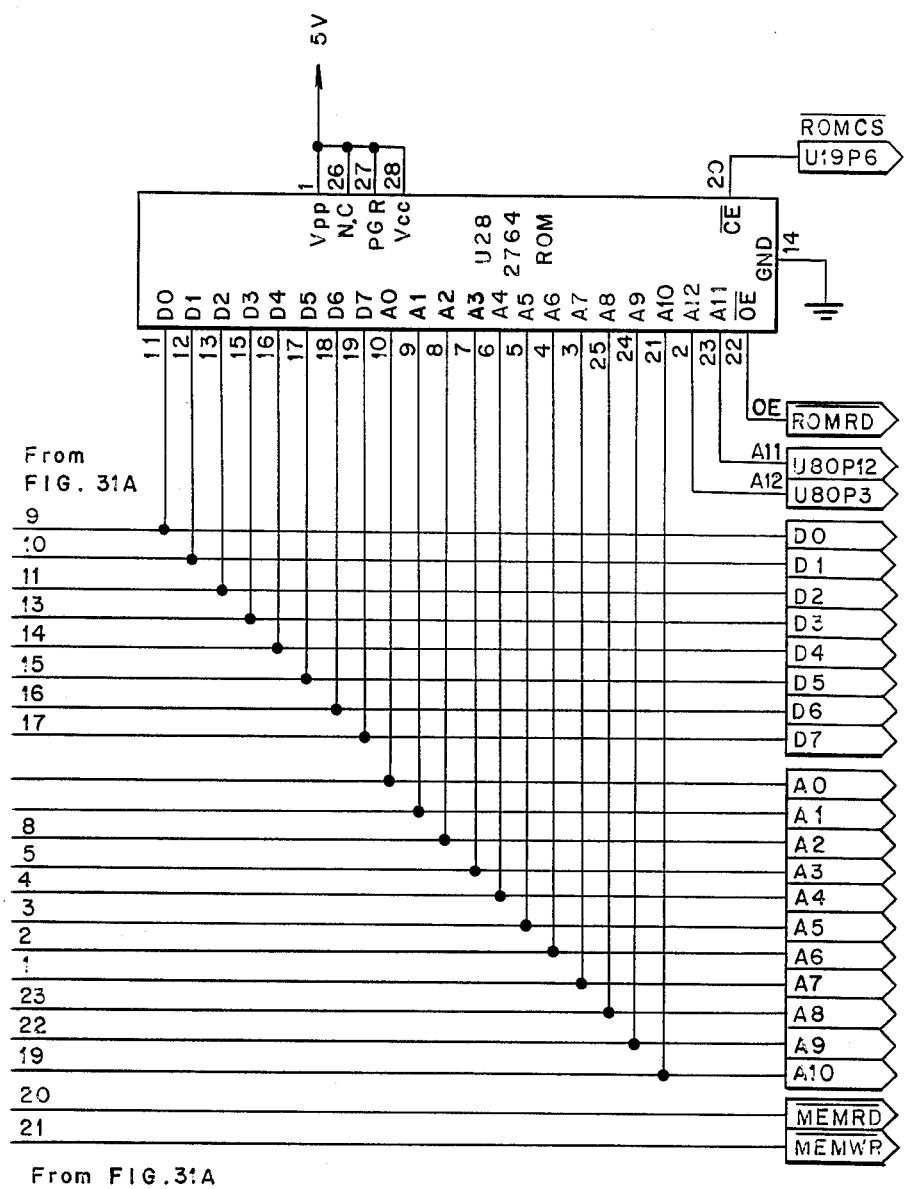

The input/output, random access memory, read only memory and data bus circuitry of the CIP is depicted in the schematic of FIGS. 31A, 31B. ROM device U28 is illustratively an Intel 2764 type device which has its data lines D0-D7 tied to data lines D0-D7 of RAM U291. Similarly, address lines A0-A10 of U28 are tied to address lines A0-A10 of U291. Signals $\overline{RD}$ and $\overline{WR}$ of RAM 291 provide for reading and writing of data. Decoder/demultiplier U20 is a 74HS138 type device while decoders/demultiplexers U21, U22 and U23 are HC138 type devices.

Referring to FIG. 32, the master address bus of the CIP comprises eight-bit, D-type, transparent latch U3 of the 74LS373 type manufactured by Fairchild which is enabled via signal ALE on latch enable pin 11 and bus driver/buffer U2 of the 74LS244 type.

FIG. 33 depicts the master status circuitry of the CIP comprising decoder U6 and inverting line driver/buffer U7. Decoder U6 supplies control signals $\overline{INP}$, $\overline{OUT}$, $\overline{HALT}$, $\overline{MI}$, $\overline{MEMRD}$ and $\overline{MEMWR}$ to buffer 240 which outputs the corresponding inverted control signals.

The disc controller circuit of the CIP is shown in FIG. 34 and comprises disc controller U74 which is illustratively a 1770 type device manufactured by SGS Semiconductor, inverting line driver/buffer U76 and line driver/buffer U73. Header 34 is supplied with control signals from U73, U74 and U76 and outputs these signals to a disc drive (not shown).

Referring to FIG. 35, there is shown the master control and utility circuitry of the CIP, comprising inverting bus driver/buffer U9 illustratively type LS240, bus driver/buffer U10 illustratively type LS244, Schmitt trigger U11 illustratively type LS14 and two D-type flip flops U13 illustratively type LS74, all manufactured by Fairchild.

While the invention has been described with reference to a specific illustrative embodiment, it will be apparent to those skilled in the art that variations and substitutions may be made which are within the scope of the appended claims.

What is claimed is:

1. A remote sensing system comprising:
   a plurality of remote sensing digital meters comprising:
      means for sensing one or more parameters of a physical quantity as a measure thereof,
      means for taking a plurality of samples of a function of the parameters sensed by said sensing means,
      means for calculating from the samples taken by said sampling means one or more numerical values representative of said physical quantity,
      means for accumulating the magnitude of the numerical value or values calculated by said calculating means,
      means for providing the accumulated value to a remote location, and
   at least one processing unit linked to said plurality of remote sensing meters via AC power lines, said processing unit comprising:
      a central processing unit,
      means for storing accumulated values received from said remote sensing meters, and
      means for communicating with said remote sensing meters, said means comprising: means for transmitting identical signals to said remote sensing meters on a plurality of spaced apart frequency bands and means for receiving signals from said remote sensing meters on one of said frequency bands.

2. The apparatus of claim 1 wherein said providing means in said remote sensing meter comprises:
  means for receiving from said processing unit signals transmitted from the processing unit on the spaced apart frequency bands,
  means for testing the validity of the signals received to locate a frequency band on which valid data is present, and
  means for transmitting signals representative of the accumulated values to said processing unit using the frequency band on which said data was received.

3. The apparatus of claim 2 wherein:
  the receiving means of said providing means comprises a mixer and a local oscillator, said local oscillator having an adjustable output to provide for the demodulation of signals transmitted in any one of the different frequency bands transmitted by the processing unit; and
  the transmitting means of said providing means comprises a mixer and said local oscillator, said local oscillator applying the same output signal to the mixer of the transmitting means as is applied to the mixer of the receiving means.

4. The apparatus of claim 1 wherein the physical quantity to be measured is energy transmitted through the electric power line over which the remote sensing meter and the processing unit communicate, and wherein the parameters measured are current and voltage in the power line.

5. The apparatus of claim 4 wherein the parameters are samples at a frequency which does not exceed twice the highest harmonic frequency present in the parameter that said remote sensing meter is capable of sensing.

6. A remote sensing digital meter comprising:
  means for sensing one or more parameters of a physical quantity as a measure thereof,
  means for taking a plurality of samples of a function of the parameters sensed by said sensing means
  means for calculating from the samples taken by said sampling means one or more numerical values representative of said physical quantity,
  means for accumulating the magnitude of the numerical value or values calculated by said calculating means, and
  means for providing the accumulated values to another location, said providing means comprising:
  means for receiving from said another location a plurality of signals at different frequency bands,
  means for testing the validity of the signals received to locate a frequency band on which valid data is present, and
  means for transmitting signals representative of the accumulated values to said another location using the frequency band on which said valid data was received.

7. The apparatus of claim 6 wherein:
  the receiving means of said providing means comprises a mixer and a local oscillator, said local oscillator having an adjustable output to provide for the demodulation of siganls transmitted in any one of the different frequency bands transmitted by said another location; and
  the transmitting means of said providing means comprising a mixer and said local oscillator, said local oscillator applying the same output signal to the mixer of the transmitting means as it applied to the mixer of the receiving means.

8. The apparatus of claim 6 wherein the physical quantity meaured is energy transmitted through an electric power line over which the remote sensing meter and said another location communicate, and wherein the parameters measured are current and voltage in the power line.

9. The apparatus of claim 8 wherein the parameters are sampled at a frequency:
  having a value not equal to the frequency of the electric power carried by said electric power line;
  having harmonics which are not equal to any harmonic below the fifth harmonic of the frequency of said electric power; and
  .having a value no more than three and one-half times the frequency of said electric power.

10. A remote sensing digital meter comprising:
  means for sensing the current and voltage in an alternating current power line,
  means for taking a plurality of samples of current and voltage values sensed by said sensing means,
  means for calculating from the samples taken by said sampling means energy transmitted by said power line, and
  means for accumulating the magnitude of the energy transmission calculated by said calculating means and means for providing the accumulated value to another location, said providing means comprising:
  means for receiving from said another location a plurality of identical signals at different frequency bands,
  means for testing the validity of the signals received to locate a frequency band on which valid data is transmitted, and
  means for transmitting signals representative of the accumulated values to said another location using the frequency band on which said valid data was received.

11. A remote sensing digital meter comprising:
  means for sensing the current and voltage in an alternating current power line,
  means for taking a plurality of samples of current and voltage values sensed by said sensing means,
  means for calculating from the samples taken by said sampling means energy transmitted by said power line, and
  means for accumulating said magnitude of the energy transmission calculated by the calculating means and means for providing the accumulated value to another location, said sampling means samples said power line at a frequency:
  having a value not equal to the frequency of said alternating current;
  having a harmonics which are not equal to any harmonic below the fifth harmonic of the frequency of said alternating current; and
  having no more than three and one-half times the frequency of said alternating current.

12. A remote sensing system comprising:
  at least one remote digital station comprising:
  means for sensing one or more parameters of a physical quantity as a measure thereof,
  means for taking a plurality of samples of a function of the parameters sensed by said sensing means and for storing data representative of such samples,
  means for providing the stored data to a remote location, and at least one processing unit linked via AC power lines to said at least one remote digital station, said processing unit comprising:

a central processing unit, means for storing data received from said at least one remote digital station, and means for communicating with said at least one remote digital station, said means comprising: means for transmitting address signals to said at least one remote digital station over said AC power lines on a plurality of spaced apart frequency bands, and means for receiving signals from said at least one remote digital station over said AC power lines on one of said frequency bands.

13. A method for communication between a central digital station and a plurality of remote digital stations over AC power lines to which the central digital station and the remote digital stations are connected, comprising the steps of:

(a) transmitting address signals from said central digital station over said AC power lines to said remote digital stations on a plurality of spaced apart frequency bands, said address signals identifying at least one of said remote digital stations;

(b) receiving at each or tne remote digital stations address siganls form said central digital station over said AC power lines on one of said frequency bands and testing the received address signals to determine it they constitute a valid address signal identifying the respective remote digital station; and (c) transmitting response signals from the remote digital station identified by said address signals over said AC power lines to said central digital station on a frequency band on which the remote digital station received valid address signals identifying the station.

14. The method according to claim 13 in which the address signals are transmitted substantially simultaneously on the plurality of frequency bands by the central digital station.

15. The method according to claim 13 in which address signals are transmitted from the central digital station over the AC power lines on at least six spaced apart frequency bands.

16. The method according to claim 14 in which the spaced apart frequency bands are in the range of from about 30 kHz to about 50 kHz.

* * * * *